US011315902B2

(12) United States Patent
Knickerbocker

(10) Patent No.: US 11,315,902 B2
(45) Date of Patent: Apr. 26, 2022

(54) HIGH BANDWIDTH MULTICHIP MODULE

(71) Applicant: International Business Machines Corporation, Armonk, NY (US)

(72) Inventor: John Knickerbocker, Orange, NY (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 16/788,459

(22) Filed: Feb. 12, 2020

(65) Prior Publication Data

US 2021/0249381 A1    Aug. 12, 2021

(51) Int. Cl.
    *H01L 25/065*      (2006.01)
    *H01L 21/56*      (2006.01)
    (Continued)

(52) U.S. Cl.
    CPC ........ *H01L 25/0652* (2013.01); *H01L 21/568* (2013.01); *H01L 23/5381* (2013.01);
    (Continued)

(58) Field of Classification Search
    CPC .............. H01L 23/5381; H01L 23/538; H01L 25/0652
    See application file for complete search history.

(56) References Cited

U.S. PATENT DOCUMENTS

| | | | |
|---|---|---|---|
| 7,649,245 B2 | 1/2010 | Zingher et al. | |
| 8,008,764 B2 | 8/2011 | Joseph et al. | |

(Continued)

OTHER PUBLICATIONS

"Stacking Method for Bridging Multiple Chips" IBM ' IPCOM000178054D Jan. 14, 2009.
(Continued)

*Primary Examiner* — Marcos D. Pizarro
*Assistant Examiner* — Antonio B Grite
(74) *Attorney, Agent, or Firm* — Daniel P. Morris; Erik Johnson; Lou Percello, Attorney, PLLC

(57) ABSTRACT

Multi-semiconductor chip modules that have a substrate with a substrate surface, one or more first substrate connections, and one or more second substrate connections. One or more first semiconductor chips (chips) has one or more larger first chip connections and one or more smaller first chip connections on a first chip bottom surface. One or more of the larger first chip connections physically and electrically connected to a respective first substrate connection. One or more second chips has one or more larger second chip connections and one or more smaller second chip connections on a second chip bottom surface. One or more of the larger second chip connections physically and electrically connected to a respective second substrate connection. A bridge has a bridge thickness, a bridge surface, and one or more bridge connections on the bridge surface. A first part of the bridge surface is under the first chip bottom surface and a second part of the bridge surface is under the second chip bottom surface. The bridge is disposed on the substrate between the first semiconductor chip and the second semiconductor chip, and one or more of the smaller first chip connections is physically and electrically connected to a respective first bridge connection on the first part of the bridge surface and one or more of the smaller second chip connection is physically and electrically connected to a respective second bridge connection. Some embodiments, a large surface bridge with the bridge. The large surface bridge and bridge can have different configurations. The bridge thickness allows larger chip connections and smaller connections with high pitch to intermingled in a location within the module. Methods of manufacture are disclosed.

17 Claims, 21 Drawing Sheets

(51) Int. Cl.
    *H01L 23/538* (2006.01)
    *H01L 23/00* (2006.01)
    *H01L 25/00* (2006.01)
    *H01L 23/498* (2006.01)
    *H01L 23/66* (2006.01)
    *H01L 25/18* (2006.01)

(52) U.S. Cl.
    CPC .......... *H01L 23/5384* (2013.01); *H01L 24/17* (2013.01); *H01L 25/50* (2013.01); *H01L 2224/1703* (2013.01); *H01L 2225/06517* (2013.01)

(56) References Cited

U.S. PATENT DOCUMENTS

| | | |
|---|---|---|
| 8,946,900 B2 | 2/2015 | Qian et al. |
| 9,595,495 B1 | 3/2017 | Patil |
| 9,595,496 B2 | 3/2017 | Lee et al. |
| 10,535,608 B1 * | 1/2020 | Rubin .................... H01L 23/12 |
| 2012/0261838 A1 * | 10/2012 | Braunisch ............... H01L 23/13 |
| | | 257/777 |
| 2016/0141234 A1 | 5/2016 | We et al. |
| 2018/0145031 A1 | 5/2018 | Braunisch et al. |
| 2019/0371778 A1 * | 12/2019 | Sankman ................ H01L 24/16 |
| 2020/0243449 A1 * | 7/2020 | Chiang ................... H01L 24/20 |

OTHER PUBLICATIONS

Boring Wu "High-bandwidth IC interconnects with silicon interposers and bridges for 3D multi-chip integration and packaging" 2017 China Semiconductor Technology international Conference (CSTIC) Year: 2017, pp. 1-3.

Kyungjun Cho; Youngwoo Kim; Hyunsuk Lee; Gapyeol Park; Subin Kim: Kyungjune Son: Sumin Choi; Joungho Kim"; Signal and power integrity (SI/PI) analysis of heterogeneous integration using embedded multi-die interconnect bridge (EMIB) technology for high bandwidth memory (HBM)" 2017 IEEE Electrical Design of Advanced Packaging and Systems Symposium (EDAPS); Year: 2017, pp. 1-3.

* cited by examiner

HIGH BANDWIDTH MULTICHIP MODULE

BACKGROUND

The present invention relates to interconnection of semiconductor chips (chips) on modules. More specifically, the invention relates to interconnection of chips on modules with high bandwidth and high connection density.

With circuitry scaling to smaller and smaller dimensions, interconnection density in chip circuitry is becoming more limiting on system manufacturing and performance. These interconnections include connections for power, control, signals, and/or communication between devices and chips in the module.

Examples of current interconnecting technologies include connections to a mother board (e.g. flex electrical connectors, optical interconnects, etc.); interposer layers (including silicon-based interposers, optical interposers, organic based interposer layers, etc.); and silicon-bridged multi-interposer systems; etc. Some of these interconnection technologies have bandwidth limitations that can make these interconnections unsuitable for high data rate transmissions between chips.

Many applications require high bandwidth data transfer between chips in modules that are low cost and have smaller substrate footprints. Some of these applications include cellular communications, video streaming, artificial intelligence, and gaming.

Optical connections handle high bandwidths but reduce efficiency due to the conversions between electrical and optical signals. Optical components also add complexity to the manufacturing of devices requiring communication between multiple chips.

Interposers enable high densities of connections and accommodate higher bandwidth requirements for short connections, but these advantages diminish as the number of connections within the interposer increases.

Silicon-bridge technology, e.g. integrated in 2.5D or 3D on a substrate/wafer, enables high-bandwidth communication between chips via the bridge. However, this technology introduces package complexity and substrate processing.

Supporting high density and/or mixed pitch interconnection for power and signal interconnections require fine pitch, high density wiring (such as less than 3 to 10 micrometer (um) line widths and line space on a layer) and high density interconnection such as less than 30 to 120 um pitch area array connections in some regions of the integrated module. Manufacturing and packaging these modules are complicated further by mixing contacts and interconnections are different sizes and shapes. For example, power delivery wires and connections and interconnections between die and packages and boards can tend to be larger than those required for signals, control, or communication so mixing the two connection types complicates the connection pitch and density during design, build, and assembly of modules and systems.

In addition, high X and Y positional accuracy for lines, line spaces, and pad, pillar and bump connections become more critical for high densities. Accurate positioning is needed for pads, solder, copper, metal and pillar connections and other types of interconnections to dies, bridges, chips, chip stacks, and substrates for use in memories, central processing units (CPUs), graphical processing units (GPUs), field-programmable gate arrays (FPGAs), and other components.

Components with tight tolerance interconnections also cause problems in modules if the components have different coefficients of thermal expansion (CTE). Components with different CTEs expand in different ways with temperature changes. This can cause warpage and problems in maintaining planarity and contact integrity in modules with high connection density and mixed pitch connections. Warpage and changes in planarity are more problematic in modules with high density and varied connection types because the tolerances are tighter. As a result, problems arise in build and assembly yield and component application reliability.

There is a need to improve the manufacture, packaging, and use of higher density and mixed pitch connections in modules where the connections are placed in precise locations with precise heights while minimizing warpage and planarity effects on these connections and interconnections in modules.

SUMMARY

Embodiments of the present invention are multi-semiconductor chip modules that have a substrate with a substrate surface, one or more first substrate connections, and one or more second substrate connections. One or more first semiconductor chips (chips) has one or more larger first chip connections and one or more smaller first chip connections on a first chip bottom surface. One or more of the larger first chip connections is physically and electrically connected to a respective first substrate connection. One or more second chips has one or more larger second chip connections and one or more smaller second chip connections on a second chip bottom surface. One or more of the larger second chip connections physically and electrically connected to a respective second substrate connection. A bridge has a bridge thickness, a bridge surface, and one or more bridge connections on the bridge surface. A first part of the bridge surface is under the first chip bottom surface and a second part of the bridge surface is under the second chip bottom surface. The bridge is disposed on the substrate between the first semiconductor chip and the second semiconductor chip, and one or more of the smaller first chip connections is physically and electrically connected to a respective first bridge connection on the first part of the bridge surface and one or more of the smaller second chip connection is physically and electrically connected to a respective second bridge connection.

In some embodiments, a large surface bridge is disposed between the bridge and the substrate.

In some embodiments, the bridge is embedded in the substrate. In other embodiments, a large surface bridge is disposed on the substrate and covers the embedded bridge.

The bridge thickness allows the larger first chip connections, the smaller first chip connections, the larger second chip connections, and the smaller second chip connections to intermingled in a location within the module. In some embodiments, the electrical connections are made with equal and uniform force on all contacts.

Materials and configurations are chosen to maintain a planar spacing between the chip bottom surfaces and the substrate surface, bridge surface, and/or large surface bridge surface.

Methods of manufacture are disclosed.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

DETAILED DESCRIPTION

Figure 1A:
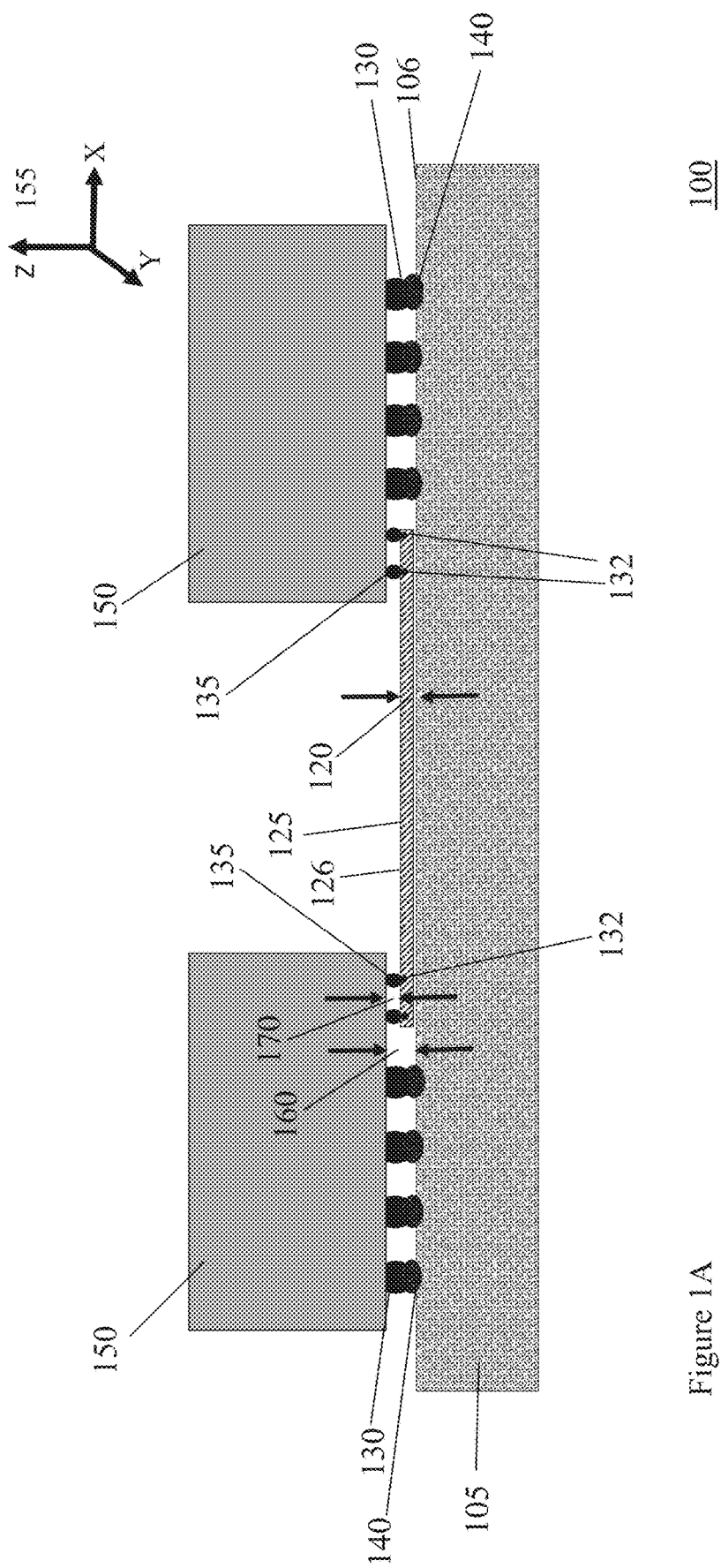
FIG. 1A is an elevation view of an example embodiment of two chips on a ceramic or organic substrate and bridge forming a multi-chip module.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, contact etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

The present invention uses bridges or bridge chips on MCMs for active function, high density, and mixed type interconnection wiring operating at high bandwidth. The bridge chips can be implemented at low cost on a smaller MCM surface area.

The bridges include as non-limiting examples silicon bridges with or without active circuits and with or without through silicon vias (TSV). The bridges can be made from silicon (Si) material, glass material, organic material and/or alternate materials. The bridges can be disposed on the surface of package/substrate, as above a planar package/substrate surface; embedded in the package or substrate; or embedded in the package or substrate with the top surfaces of the substrate and bridge coplanar.

There may be one or more bridge or high-density interconnection regions added to or build with the package/substrate. There can be bridges assembled with the chips or chips/chip stacks as subcomponents that are then assembled within the modules. Alternatively, bridges can be assembled first in the package, e.g. on a substrate. Bridges can vary in thickness. Combinations of different types of bridges can be assembled in a single module.

In some embodiments, flatness or planarity of substrates, bridges, packages, and/or dies and their respective interconnections is maintained. Maintaining flat or planar surfaces helps keep the height of connections the same on the planar surfaces. Planar surfaces, in combination with other invention features, keep the height of contacts uniform, particularly during thermal cycling that occurs during module assembly and operation. Planarity of surfaces is particularly important for connections made to larger chips. Chip contacts that are on the edges of larger chips, e.g. further away from a chip center or "neutral point", are prone to move away from a bridge or substrate surface, due to warpage, e.g. planarity changes due to thermal cycling.

Contacts with different thicknesses or heights can be connected through (planar) bridges of different thicknesses so contact sizes/heights can be mixed in a location without contacts having different amounts of compressive force.

In some embodiments, e.g. for high speed, low power, and high bandwidth interconnects, signal integrity is enhanced by selecting planar, smooth bridges made of dielectric materials with low dielectric constant, k, material and/or a low loss tangent. (A dielectric material at a given frequency has a loss tangent measured by the ratio of real and imaginary parts of impedance of a capacitor made of the material. A low loss tangent dielectric has less dielectric absorption of energy than a higher loss tangent material.)

In some embodiments, modules provide power from a board or connector to package(s) and to die or die stacks. Power connections and interconnects can be of different sizes, shapes, materials, and thicknesses than signal, control, or communication connections and interconnections. Aspects of the present invention enable mixing signal (control and communication) and power connections in the same or near locations in the bridges and other module components. Connections and interconnections are precisely placed in an X and Y location and thicknesses of connections are precisely formed to facilitate mixing of connection types these locations in the module.

In some embodiments, material selection and connection and interconnection designs are used to minimize the changes in planarity due to warping and other thermal effects. Warping can be reduced by selecting materials, e.g. low temperature solder, that cooperate to reduce the effect of differences in the coefficient of thermal expansion (CTE) of the materials. Materials and component configurations, e.g. pillar height, can also be chosen to reduce undesirable effects, e.g. brittleness, of the materials.

Precise placement of thermal vias improves cooling efficiency. Cooling is also enhanced by locating and selecting high thermal conductivity materials and pastes; dielectrics, heat sinks, heat pipes, or through air, single phase or two-phase cooling or combinations therein.

Refer now to the Figures.

FIG. 1A is an elevation view of an example embodiment of two chips 150 on a ceramic or organic substrate 105 forming a multi-chip module (MCM) 100. Chip connections (130 and 135), e.g. C4 connections (130, 135), connect circuitry within the chip 150 to circuitry external to the chip 150.

In some embodiments, chip connections (130, 135) have different sizes. In this example chip connections 130 have a larger cross section area and are taller in height than chip connections 135. In some embodiments, chip connections 130 can be used for power transfer because they have lower resistance and would produce less heat for a given amount of current than chip connections 135. On the other hand, the larger chip connections 130 can not be as densely organized and can not have as high a pitch as the smaller chip connections 135. Since chip connections 135 can have a higher pitch and density than the larger chip connections 130, the chip connections 135 could be more suited for high density signal, communications, and control interconnections that require less current capacity than chip connections used for power distribution, e.g. chip connections 130.

Shorter connection height is good for fine pitched interconnections, e.g. signal, communication, and control connections. However, larger connections, e.g. for power distribution, are also needed. Having different heights for connections creates difficulties in joining chips (or memory stacks, multiple die stacks, etc.) to the substrate 105 to make electrical connections.

A silicon bridge 125 is disposed on the ceramic substrate 105 and is under a region of one or more of the chips 150. One or more bridge contacts 132 are on the bridge surface 126. Bridge connections 135 connect circuitry in the chip 150 through the bridge contacts to circuitry within the bridge 125 and/or to the other chips 150. In some embodiments, the chips 150 sit above the bridge 125 and the chip connections 135 connecting to the bridge 125 are smaller in height than the chip connections 130 connecting to the substrate 105.

The connections within the bridge 125 include connections for power, signals, control, and/or communication. Other connections are envisioned. The connections can be between two or more of the chips 150 and/or between one or more of the chips and other circuitry, e.g. between a substrate connection 130 on a chip 150 and a connection to circuitry on or within the bridge 125 and/or ceramic substrate 105.

Different types of chip connections (130, 135), e.g. chip connections for power distribution and chip connections for signal/control/communications, can encounter difficulty when connecting to contacts on the substrate 105. For example, for signal chip connections 135 to contact a top surface 106 of the substrate, the power chip connections 130 would have to be compressed and/or stressed to be shortened in height. If the power chip connections 130 are not compressed, the signal chip connections 135, being shorter, will not contact the top surface 106 of the substrate 105.

To address this situation, a bridge 125 is disposed between the signal chip connections 135 and the surface 106 of the substrate 105. The bridge 125 has a bridge thickness 120 that is thick enough so the signal/control chip connections 135 make electrical contact with circuitry within the bridge 125 as the power chip connections 130 (for example) are contacting circuitry within the substrate 105. In alternative embodiments, there are substrate connections 140 disposed on the surface 106 of the substrate 105 that contact the larger chip connections 135. In these embodiments, that bridge thickness 120 can be thicker to make up for any height the substrate connections 140 sit proud of the surface 106 of the substrate 105.

The thickness of the bridge 125 can be made so that the amount of force (stress) used to make electrical contact is the same for each of the chip connections (130, 135).

In some embodiments, the bridge 125 can have bridge connections, e.g. like 140, not shown, that electrically connect with the signal/control chip connections 135 in the same manner that the power chip connections 130 connect with the substrate connections 140.

In some embodiments, the substrate connections 140 (and/or the bridge connections) provide a precise location in the X and Y directions on the surface 106 of the substrate 105 (surface 126 of the bridge 125). (As shown by the direction indicator 155, the X direction is defined as the left/right horizontal direction, the Y direction is defined as the horizontal direction into and out of the figure, and the Z direction is the vertical direction. The height of the connections, e.g. between the bottom of a chip and the surface 106 of the substrate 105 or bottom of the chip to the surface 126 of the bridge 125 is measured in the Z direction).

Substrate connections 140 (and/or bridge connections on the bridge surface 126) can be located on a surface by standard lithographic or laser ablation techniques. For example, a mask covers the surface 106 of the substrate 105, a resist is applied, and an etch is performed after the mask is removed. Holes result in the surface 106. Alternatively, the precisely located holes can be created by laser ablation. In other embodiments, the precisely located holes can be created in a permanent mask layer with etched holes. Using known techniques, the surface (106, 126) holes can be plated or filled with injection molded solder to physically and electrically connect pads, e.g. substrate connections 140 on the substrate 105 (or bridge 125).

Via holes or arrays of via holes can be created by etching or ablating through one or more layers to create a through hole. The through hole can be plated or filled using injection molded solder (or other known techniques) to form the via, e.g. a TSV.

Different types of substrate connections 140 can be created. For example, using solder or solder composite (e.g. solder/nickel/copper) pillar structures, a pad array on the bridge 125 or substrate 105 surface (126, 106) can be created. Temperature and pressure can be used to "coin" or flatten the surface of the interconnections on substrate/bridge side and on chip 150 side to tighten the height tolerance to less than 1 to 3 um planarity across area of interconnections with pitches less than 30 to 120 um.

These techniques can create different shapes of substrate connections 140, e.g. with narrow or wider cross sections, and can accurately position larger connections with lower density and pitch, e.g. 130, together with smaller connections with higher density and pitch, e.g. 135, so different types of connections are intermingled at different locations on the surface 106. Height of the connections can be controlled by plating or deposition techniques or by controlling the thickness of a permanent mask, or as described below, the thickness of a large surface bridge. Arrays can be created on the surface 106 of the substrate and/or bridge surface 126 within a tolerance of less than 1 to 3 um.

Materials can be selected to create flat or planar surfaces. If the substrate 105 has a flat/planar surface 106, the distance or spacing 160 between the substrate 105 surface 106 and the bottom of the chip 150 will be constant and equal, within a spacing tolerance, throughout the entire vertical projection of the chip 150 onto the surface 106. In similar manner, if the bridge 125 surface 126 is planar, the distance or spacing 170 between the bridge 125 surface 126 and the bottom of the chip 150 will be constant and equal, within a spacing tolerance throughout the entire vertical projection of the chip 150 onto the bridge 125 surface 126.

Note that during operation (or assembly/manufacturing), differential heating or material differences can create variations in the planar spacings (160, 170) even if planar materials are used. Matching CTEs of materials, as described below, is used to maintain spacings (160, 170) and planarity within a tolerance of less than 1 to 3 um even during thermal cycling.

Having planar surfaces (106, 126) to create uniform spacing (160, 170) is advantageous for many reasons. The height of the substrate connections 140, chip power connections 130, chip signal connections 135, and bridge thickness 120 can be designed so that there is a uniform pressure/force of near equal value for each connection made to the chip 150. As such these dimensions can be designed so that minimum and uniform stress is applied at each connection while guaranteeing each connection is electrically completed. Any adhesive and/or thermally conductive material (TIM) that is interposed in the planar spacing (160, 170) will have a uniform thickness. Therefore, the change in stress imposed by the adhesive/TIM layers at changing temperatures, at least for a constant temperature profile, will be constant over any of the planar spacing (160, 170) between the planar surfaces, e.g. between the chip 150 bottoms and the substrate 105 surface 106 or bridge 125 surface 126. As a result, connections (130, 135) of different types, densities, and pitch can be located together and intermingled while still maintaining good electrical connection with minimum and uniform stress on each connection (130, 135). In some embodiments, the larger connections 130 are grouped to connect between the chip 150 bottom and substrate 105 surface 106 while the smaller connections 135 are grouped (in proximate location to the grouped larger connections 130) between the chip 150 bottom and bridge 125 surface 126.

Choosing materials with similar CTEs and modulus of elasticity causes surfaces (106, 126) to maintain planarity and spacings (160, 170) and to remain uniform during cycling temperatures (assuming no differential heating across surfaces) experienced during manufacture and operation.

The bridge 125 can be made from materials like organic dielectric with a controlled thickness, modulus and CTE; a glass; or a ceramic dielectric. Note a bridge 125 or substrate 105 with a composite structure or hybrid layered structure will have CTE that is affected by the layers in the composition. For example, a module 100 will have an overall CTE determined by the substrate 105 material including any layers in the substrate; any build up layer, e.g. the bridge 125; and any metal wiring amount and density within each of the layers. Materials used as underfill, adhesives, and TIMs as well as configuration of components also affect the overall CTE.

Figure 1B:
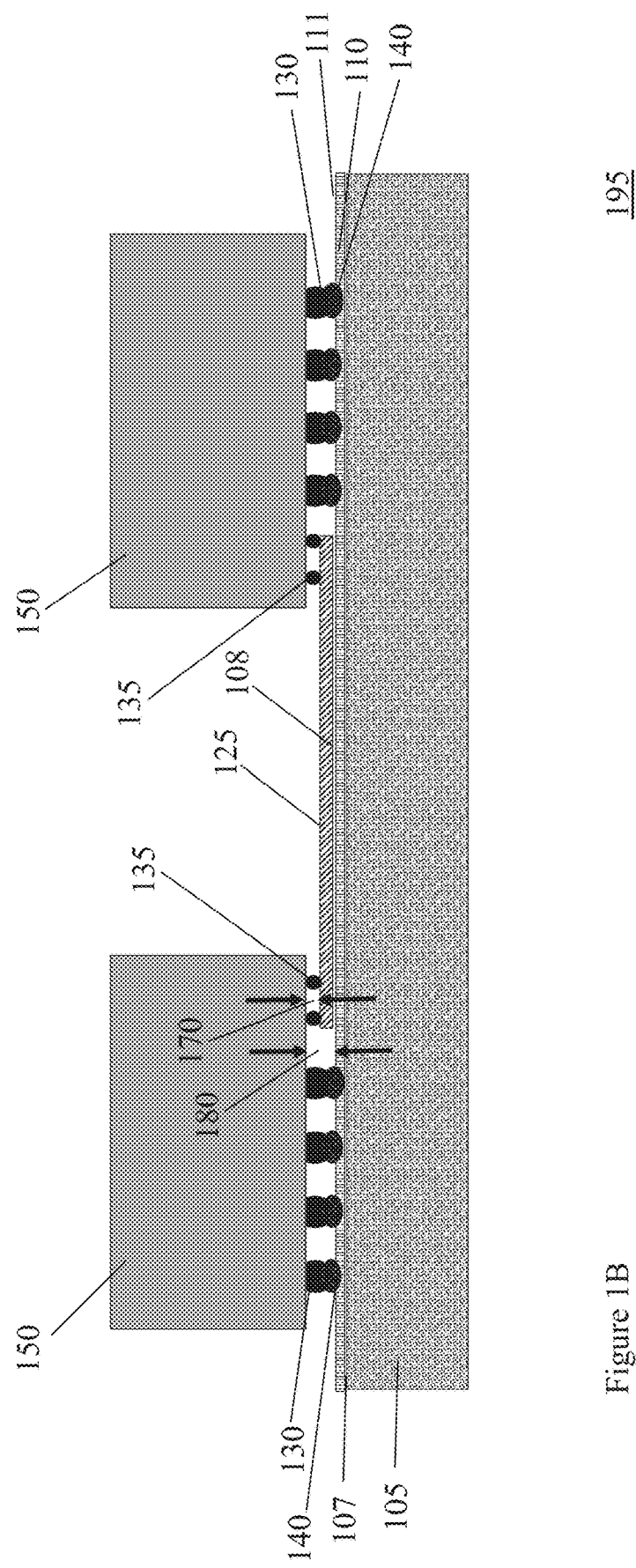
FIG. 1B is an elevation view of an example embodiment of two chips on a large surface bridge and bridge disposed on a ceramic or organic substrate forming a multi-chip module.

FIG. 1B is an elevation view of an embodiment of two chips 150 on a on a large surface bridge 110 disposed on a ceramic or organic substrate 105 forming a multi-chip module 195. The large surface bridge 110 covers the substrate 105 in an area large enough to interconnect at least two of the chips 150. Larger areas are envisioned for the large surface bridge 110 to cover.

In some embodiments, the substrate connections 140 are created in holes in the large surface bridge 110. The holes can be made using the same method as described for the substrate 105 in the description of FIG. 1A. In this embodiment, the height of the substrate connections 140 can be accurately controlled by the thickness of the large surface bridge 110.

In some embodiments, the large surface bridge 110 is made from a flat, planar material. This insures a planar region on the substrate 105 over the entire surface 111 of the large surface bridge 110 with less than 1 to 3 um variation from a perfectly flat plane. In this embodiment, the planar spacing 170 is still between the chip 150 bottom and the surface 126 of the bridge 125. However, a uniform planar spacing 180 exists between the chip 150 bottom and the surface 111 of the large surface bridge 110. In some embodiments, the large surface bridge 110 covers the entire surface of the substrate 105.

In some embodiments, the bridge 125 and large surface bridge 110 are made of low k, low loss (e.g. low loss tangent) material such as organics, glass, or ceramic or composites thereof. The bridge 125 and large surface bridge 110 can be made of layers of materials and contain interconnection wiring.

The bridge 125 and large surface bridge 110 can be made of a single layer or multiple layers. Typically, wiring/interconnections are disposed within the bridge (110, 125) layer(s). The wiring is used to connect signal/control/communication connections 135 and/or power connections 130 between dies or between dies and die stacks or other connections. The connections provide a high data rate signal with low loss and low power consumption. Shielding may be provided depending on wiring line and line space dimensions, metal trace length, smoothness of metal trace and properties of dielectric layer(s). Active and/or passive components also can be contained within the bridge 125 and large surface bridge 110.

Embodiments of the bridge 125 and large surface bridge 110 can be manufactured as separate components. The bridge 125 can be attached to the large surface bridge 110 by an adhesive 108 applied at the interface surface of the bridge 125 and large surface bridge 110. The large surface bridge 110 can be attached to the substrate by an adhesive 107 at the surface interface between the large surface bridge 110 and the substrate 105.

The modules (100, 195, 198) can be assembled in different ways. The bridge 125 and large surface bridge 110 combination can first be attached to the substrate 105. Then the chips 150 would connect to that assembly. Alternatively, a sub assembly can be made by attaching the chips 150 first to the bridge 125 and/or bridge 125 and large surface bridge 110. Then the entire sub assembly would be attached to the substrate 105. In some embodiments, the large surface bridge 110 is used as a handle to place the sub assembly on the substrate 105.

In some embodiments, materials and structures are chosen to accommodate the targeted component sizes to support acceptable levels of mis-match of CTEs during structure build and component assembly and to support application thermal excursions or cycles during use in order to support product reliability requirements. Factors that are taken into consideration include materials properties such as modulus and CTE as well as component sizes, structures, interconnection structures, compliance and use of reliability enhancing materials, geometries, and structures and integration methods. (Examples include use of acceptable interconnection pads, bumps, and pillars. Proper adhesive and modulus properties are considered, such as underfill materials and height/structure of the interconnections). Non limited examples of bridge 125 and large surface bridge 110 materials include organic dielectrics with controlled thicknesses, modulus, and CTE; glass; and ceramic dielectrics. Adhesives, underfill and/or TIMs have thicknesses controlled by planar spacings 160, 170, 180 and have a modulus and CTE selected to match other materials in the bridge 125 and large surface bridge 110 or have mis-match of CTE wherein the stress due to material property CTE mismatch and modulus does not lead to failure in processing, assembly or during product use.

Composite substrates 105 or hybrid substrates 105 will have an aggregate CTE that can be based on: composition of surface layer(s), e.g. the bridge 125 and large surface bridge 110; substrate 105 material; metal wiring/density (105) within the substrate 105, bridge 125, and large surface bridge 110: and the number of layers within the substrate 105, bridge(s) 125, and large surface bridge 110.

For example, a glass bridge 125, organic bridge 125, silicon bridge 125 or alternately a high wiring density bridge 125 on an organic substrate 105 can have controlled CTE and thus support high yield assembly and robust product reliability. Typically, the CTE for electronic components is about 3 ppm for silicon (Si)). Industry available organic substrates with core layers and build up layers typically have CTE's of 18 ppm and more advanced CTE engineered materials such as polyimide or alternate materials/structures have CTE's between 3 ppm and 18 ppm. Certain printed wiring boards (PWB) have a CTE of about 18 ppm and therefore may provide an "improved" or "controlled CTE" or limited differential CTE between the die(s), Si interposer and organic package depending on the size and configuration of the dies, bridge chip 150 and each of their respective interconnections (130, 135).

(A printed wiring board (PWB) is a board that configures the arrangement of its circuitry with conductive paste or via a chemical method such as plating or etching a conductive circuit pattern onto an insulated substrate.)

An "integrated die 150 and bridge 125" may be engineered with minimal differential bridge CTE. For example, the CTEs in the X-Y direction for the bridge 125, die 150, and organic package 105 can be chosen closer to 3 ppm (the CTE of silicon), such as between 3 ppm and 12 ppm based on the material and/or structure, to reduce stress during processing. Examples of these materials include polyimide organic polymers or alternate polymer compositions or packages. This selection reduces stress for larger X-Y size silicon dies 150 mounted on organic packages 105 during processing and enhances product reliability.

A second method to reduce stress for mis-match in CTE between die(s) 150 and packages 105 or between die(s) 150, packages 105, and bridge components (110, 125) is to use lower temperature excursions or changes during processing, assembly and/or in product use. For example, use of a lower assembly temperature can aide in lower stress for the integrated module, e.g. 195. Use of high melting point solders (with a composition like high lead (Pb), about 97%, and tin (Sn) about 3%) can melt at about the 300 degrees Celsius (C) to 350 C range and therefore have "about 300 degrees Celsius (C)" change in temperature from melting point/joining/solder solidification near 325 C and to cool down at a room temperature of 25 C. Whereas lead free solders (with a composition like Sn about 95% and remaining 5% of silver (Ag) and/or Copper (Cu)) melt from about 217 C to about 331 C and thus have about "200 C" change in temperature from melting point/joining/solder solidification to room temperature. For other lead free solders (such as Indium (In) about 52% and Sn about 48% and other metal alloys Sn-Bismuth (Bi)) and other lower melting point alloys, melting temperature can be about 120 C to about 160 C which permits solder melting point/joining/solder solidification to room temperature range of about "100 C-125 C".

By selecting the solders with a matching modulus, appropriate size and structures, and lower interconnection to room temperature cooling, differential CTE stresses are reduced from about 33% to 66%.

However, each solder typically has different mechanical properties (such as elastic modulus) and thus the stress reduction is not only impacted by temperature difference from join temperature/solidification of the solder down through cool down to room temperature. Other contributing factors include physical properties like interconnection height, diameter, number of connections and/or use of underfill adhesive between the die 150 and package 105 or components of different CTE.

Selection of a lower elastic modulus interconnection material that can also support flexibility of the interconnections without brittle cracking or high strain is a third method to reduce stress.

Designing longer or taller interconnections is a fourth way to reduce stress. Interconnections that are 100 um high versus 50 um high difference reduce stress due to CTE mis-match in connections between die 150 to organic package 105 or die to bridge package (110, 125). The stress is reduced especially for small diameter interconnections in large X and/or Y area array form factors and the when the connection has a larger Distance to Neutral Point (DNP) For example, with all other factors equal, components or connections with a large DNP, e.g. at a corner of a chip 150, will have less thermal stress if they are taller and smaller in cross section.

Applying one or more of these methods help enable high bandwidth interconnections by defining materials, designs, structures, processes and assembly. As such, integration of die(s) into packages with mixed size connections (130, 135) can support new applications like artificial intelligence (AI) architectures for product applications from large high-performance systems and cloud solutions to mobile applications and internet of things (IoT).

A few examples of fine pitch interconnections and structures that can aide in high bandwidth modules while accommodating an acceptable level of CTE mismatch between die(S), die stacks, central processing unit (CPU), graphical processing unit (GPU), Accelerator Die, Memory Die, Memory Die stacks, Bridge interconnections and packages of different CTE and printed wiring boards follow.

For high bandwidth, fine pitch interconnection, positional accuracy and height of pads, bumps, and pillar structures as well become very important depending on the factors discussed above such as CTE of components, interconnection joining temperature, modulus of the components and interconnection structures, underfill materials and structures, X-Y size of components, pitch of interconnections between die, spacing of die, bridges, packages, PWB, etc. For example, industry publications had long used large die of 400 $mm^2$ to 700 $mm^2$ joined to ceramic packages with lower CTE mismatch (Si 3 ppm vs ceramic of 3 ppm to 7 ppm to avoid significant stress for solder bump pitch of about 150 um to 250 um for area array interconnections with solder height of about 70 to 100 um using high melt solder either with or without underfill adhesives. Over the last 10 to 15 years applications, large die of 400 $mm^2$ to 700 $mm^2$ have been joined to organic packages with a larger CTE mismatch (Si 3 ppm and organic packages of 8 ppm to 18 ppm using lead free intermediate melting temperatures and use of adhesive underfills to enhance product reliability life of the solder interconnections prior to failure at the largest distance to neutral point locations. In these applications, interconnection pitch has a range from about 150 microns to 300 um pitch and solder height as been in the 70 um to 100 um height range. Some more recent applications have used fine pitch, high interconnection density die sizes have been from about 200 $mm^2$ to about 500 $mm^2$ and interconnection pitch has been at about 50 um to 150 um and substrates of Silicon have been used in connection with the die and a base package of ceramic or organic. In these applications at 50 um pitch of solder bumps use pillar heights about 15 um to about 25 um whereas solder bumps with a pitch of 100 um to 150 um use solder bump or pillar heights of about 30 um to 40 um. For future higher bandwidth interconnection, use of organic packages, organic packages with multiple chips, bridge chips, and other hybrid integrated packages with multiple die, one or more package types and base PWB, the high bandwidth die and bridge chips and/or packages can benefit from increase solder bump height, pillar height, uniformity of pad, bump and pillar height and locations and use of adhesives. This will support higher yield assemblies and more robust interconnections that can support assembly integration, some CTE mismatch between die and components and package and PWB as well as product reliability.

In some embodiments, materials are selected with CTEs between 3 ppm and 18 ppm. Further, low CTE package materials are selected including Si, glass, and/or some low CTE organic polymers (e.g. some classes of polyimide or alternate materials). These materials have a CTE between 3 to 8 ppm in the X-Y planar expansion. Using these materials permits having shorter interconnection heights (e.g. between 10 to 25 um height at 30 to 50 um pitch). For smaller die sizes or larger die sizes where materials (e.g. some organic materials) have a higher CTE, e.g. between 8 and 18 ppm in the X-Y planar expansion, taller height interconnections, e.g. between 20 um and 50 um in height at 30 um to 50 um pitch are selected to support robust reliability for applications especially for larger die sizes such as greater than 8 to 15 mm.

In addition, the interconnect structures at finer pitch should maintain adequate anchor to the substrate and under-bump metallurgy, and adequate compliance such as with solder for number of reflow cycles and/or time and temperature of reflow to avoid excessive intermetallic compound thickness in the interconnect structure which can be more brittle than an interconnection which also includes intermetallic and solder. Further, use of lower temperature bonding between higher CTE mismatch of die, die stacks, bridge materials, package material and PWB can reduce stress of the structures and support enhanced application reliability with design and use of proper interconnection heights for area array interconnections between any of these structures.

Similarly, these or other interconnection's with or without added adhesives such as but not limited to pre-applied or post join underfill adhesive can be optimized with CTE of package and bridge materials and surface materials on package, interconnection height and diameter, and interconnection compliance to support targeted size die, and thermal cycles for robustness in application reliability.

Interconnect structures, e.g. 130, 135, and 140 include micro bumps or pillars with mixed pitch and different sizes of bump or pillar diameters and height. Interconnect structures (130, 135, 140) can be made of solder, solder composites (e.g. solder/nickel (Ni), or any other known electrical contact materials. Pillars can be known micro pillars made from copper (Cu), solder, and solder composites, e.g. solder/Ni/Cu, and Cu pillar/Ni/Solder/Ni/copper. These connections accommodate precision assembly at high yield and support robust connections during use/operation such as power up and down and other thermal cycles. The connections can support vertical power delivery while managing or minimizing electro-migration from substrate 105 to die 150, substrate 105 to bridge 125 to die 150, substrate 105 to bridge 150 to die stack (250, 350), substrate 105 to die 150 and/or die stack (250, 350), or any other combinations of these interconnections.

In some embodiments, height of the interconnect structures (130, 135, and 140) is controlled to accommodate stresses occurring during manufacture and operation. For example, for fine pitch input/output (I/O), e.g. control, communication, or signal connections, a pitch of 50 um (25 um interconnection diameter) or smaller can be used. In some embodiments, pillars with a pitch about 50 um pitch use pillars with a shorter height, e.g. for a Cu pillar about 10 um high or for a solder connection about 5 um high.

However, the metallurgy of these interconnect structures (130, 135, and 140) can affect the design targets for the interconnect structure dimensions. For example, with one or more solder reflows or with thermal compression bonding, typically the smaller solder interconnections can convert to an intermetallic composition which is rigid and fragile. To achieve more pillar (interconnect) flexibility, interconnect heights are increased. For example, for applications with higher thermal cycling during manufacturing and/or operation, the height of solder interconnections can be increased to about 10 um to 20 um or more to increase the flexibility of the interconnection and diminish the effects of changes in the metallurgy of the interconnection. Again, low temperature assembly solder can be used to reduce thermal cycle stresses and metallurgy changes during assembly provided they meet the power delivery I/O requirements with adequate current carrying levels to support the product needs without leading to electromigration defects and I/O failure in product use.

Novel interconnections use low temperature solder composition control for high bandwidth I/O such as from CPU and/or GPU to High Bandwidth Memory Chip stack or alternate memories, accelerators, or other components. Bridge chips have matching or near matching CTE and adhesive is used for the interconnections to bond bridge chips, functional chips, and packages to meet application reliability requirements.

Figure 1C:
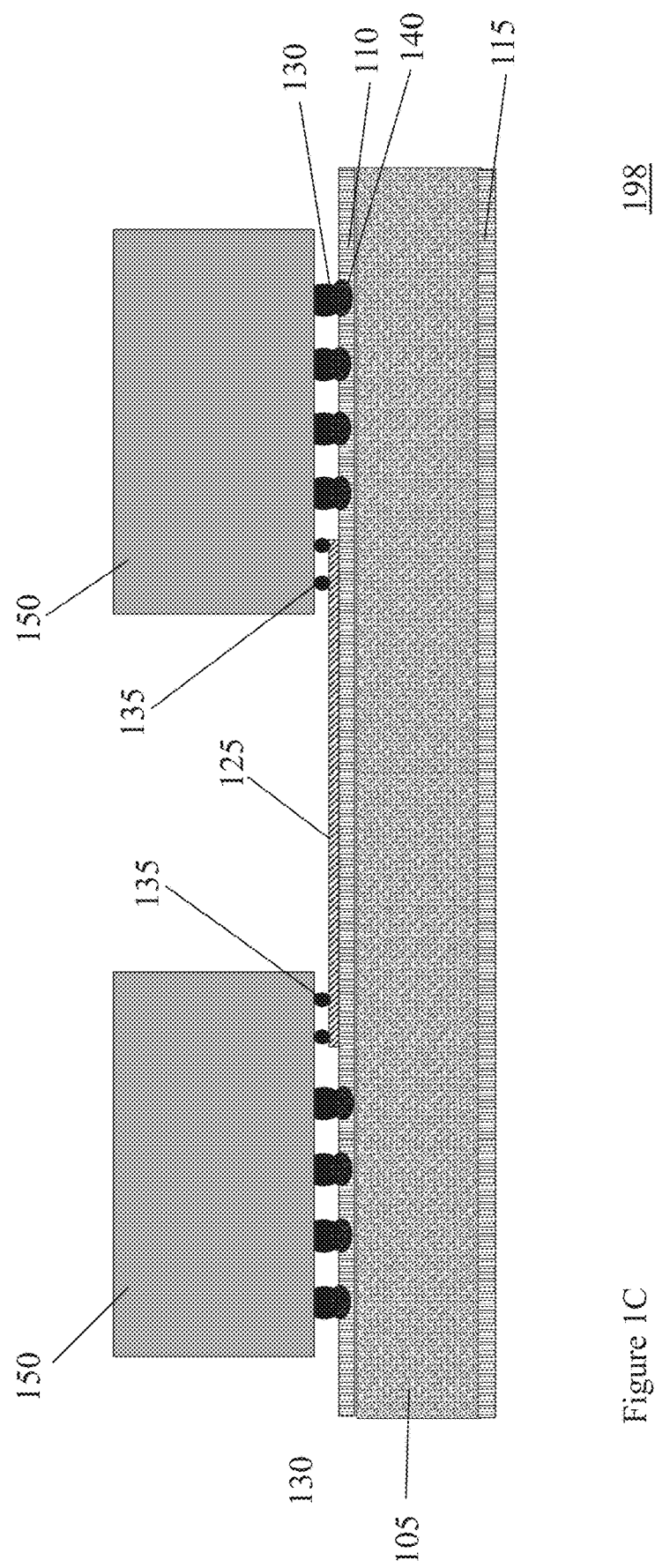
FIG. 1C is an elevation view of an example embodiment of two chips on a on a large surface bridge and bridge disposed on a ceramic or organic substrate forming a multi-chip module with a large surface handle layer.

FIG. 1C is an elevation view of an example embodiment of two chips 150 on a large surface bridge 110 disposed on a substrate 105 forming a multi-chip module 198 with a large surface handle layer 115.

The large surface handle layer 115 is disposed on the bottom of the substrate 105 using known techniques. The large surface handle layer 115 can be used to position the substrate 105 while the large surface bridge 110, bridge 125, and/or chips 150 are being attached to the substrate 105. Using the large surface handle layer 115 provides a means to control the flatness of the die, components, substrate and or bridge components to move and achieve high yield bonding/assembly. The handler 115 enables positional accuracy of features such as fine pitch pad arrays on the substrate 105 and/or bridge 125 especially when such features are built on the substrate 105 and/or bridge 125 prior to large surface handle layer 115 release. The controlled planarity of the large surface bridge 110 and bridge 125 enables accurate control of connection height and thickness uniformity of interconnections and subsequent use of adhesive and/or TIM in the spaces (160, 170, and 180). The cross section, size, and/or shape of the connections 140 is controlled by the hole patterning in the substrate 105 surface 106 and/or bridge 125 surface 126.

Figure 2A:
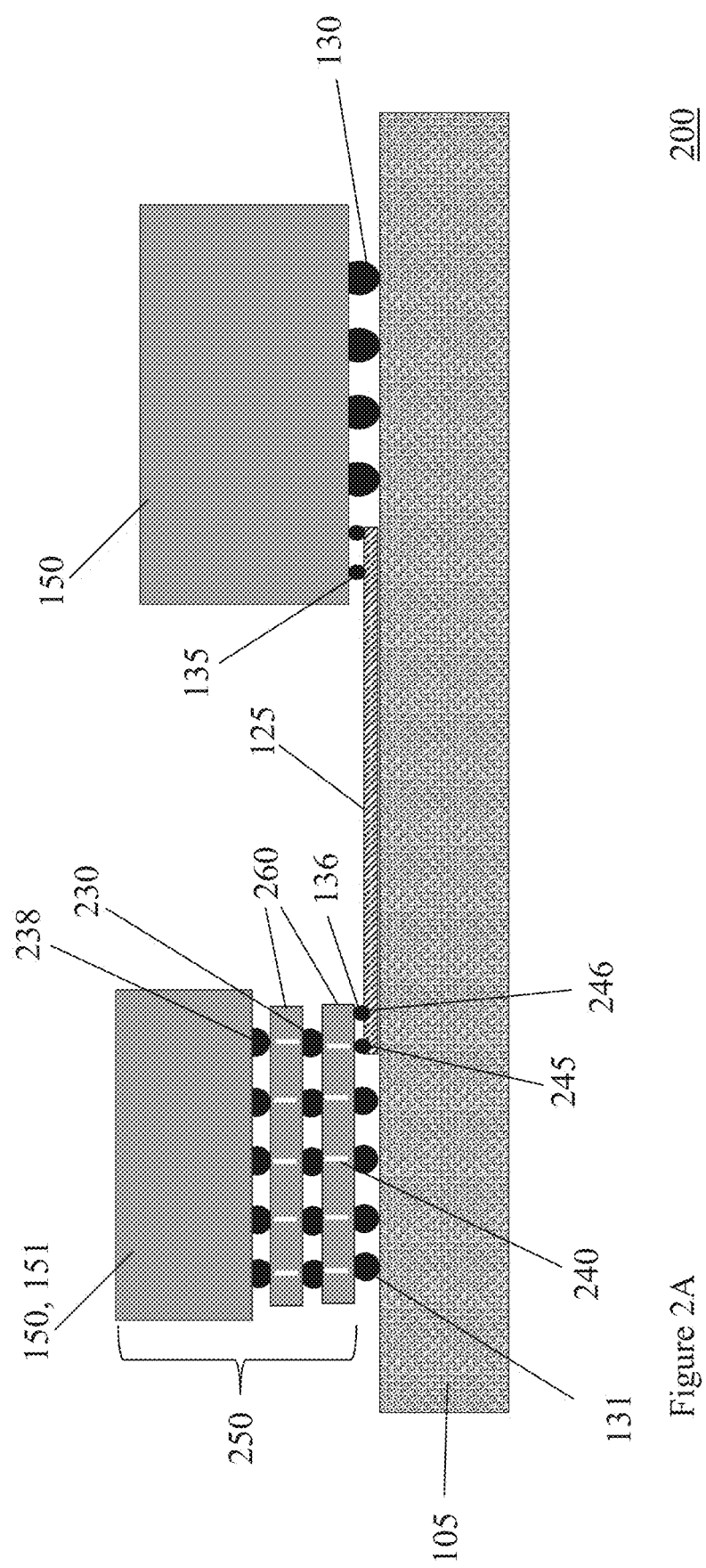
FIG. 2A is an elevation view of a chip and a die stack on a ceramic substrate with a bridge interconnecting the chip and die stack to form an example MCM.

FIG. 2A is an elevation view of a chip 150 and a die stack 250 on a ceramic substrate 105 with a bridge 125 interconnecting the chip 150 and die stack 250 to form an example MCM 200.

The die stack 250 can have one or more interconnecting layers 260. Each interconnecting layers has one or more layer connections 230, e.g. C4 bonds. Each of the interconnecting layers 260 can also have one or more layer vias 240. The layer vias 240 can be electrically conductive. The interconnecting layers 260 can also have circuitry within the layer 260. The layer connections 230 can connect from circuitry within a layer and/or from a layer via 240 to external connections 131. Some of these external connections can include external connections 131 to connections/circuitry on or within the ceramic substrate 105, from chip 151 connections 238 to chips within the die stack 250, and/or bridge connections 136 to the bridge 125 and then to bridge circuitry and/or chip connections 130 on other chips 150 not in the die stack 250.

By connecting to one or more of the layer vias 240, connections can be made from lower levels (e.g. connections from the ceramic substrate 105 and/or bridge 125 to upper level layers 260 and/or chips 151 in the die stack 250. For example, connection 245 connects circuitry and/or connections on the bridge 125 through two layer vias 240 to a chip connection 238 while bridge connection 246 connects from the bridge 125 only to a connection on a lowest interconnecting layer 260.

Figure 2B:
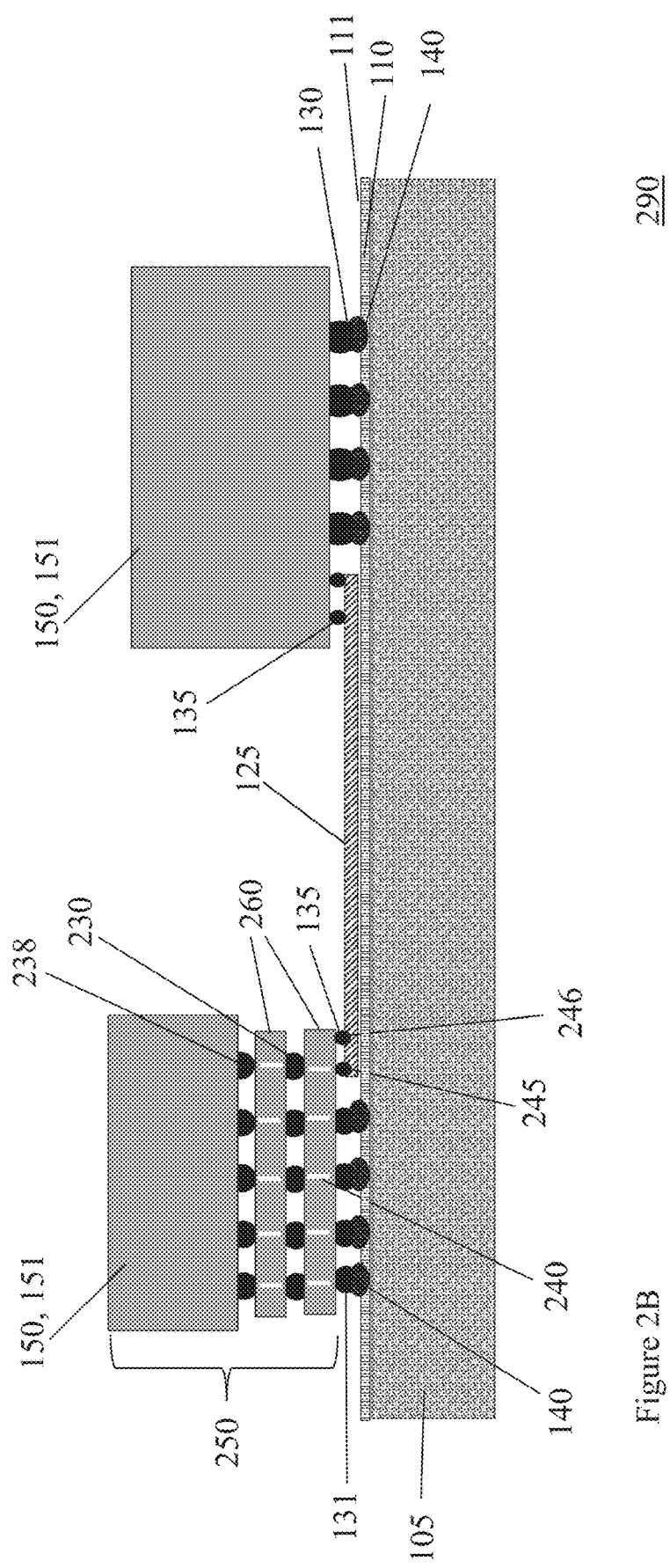
FIG. 2B is an elevation view of a chip and a die stack on a ceramic substrate with a bridge and a large surface bridge interconnecting the chip and die stack to form an example MCM.

FIG. 2B is an elevation view of a chip 150 and a die stack 250 on a ceramic substrate 105 with a bridge 125 and a large surface bridge 110 interconnecting the chip 150 and die stack 250 to form an example MCM 290.

In this embodiment, substrate connections 140 are formed in holes made in the large surface bridge 110 by methods described above. These substrate connections 140 are accurately located in X and Y directions on the large surface bridge 110 and therefore on the substrate 105. The substrate connections 140 electrically connect to the external connections 131 of the die stack 250. The substrate connections 140 can sit proud of the surface 111 of the large surface bridge 110 and, in these embodiments, the thickness 120 of the bridge 125 can increase to decrease contact forces on the external connection 131 and their respective substrate connection 140. Alternatively, the substrate connections 140 can have a top flush with the surface 111 of the large surface bridge 110 so that the thickness/height of the external connections 131 would equal the thickness 120 of the bridge 125. Similar connections (not shown) can be made in the bridge 125 surface 126, (using the same methods used to make substrate connections 140) to enable smaller (e.g. signal and/or control) contacts to contact to bridge 125 circuitry.

Figure 3A:
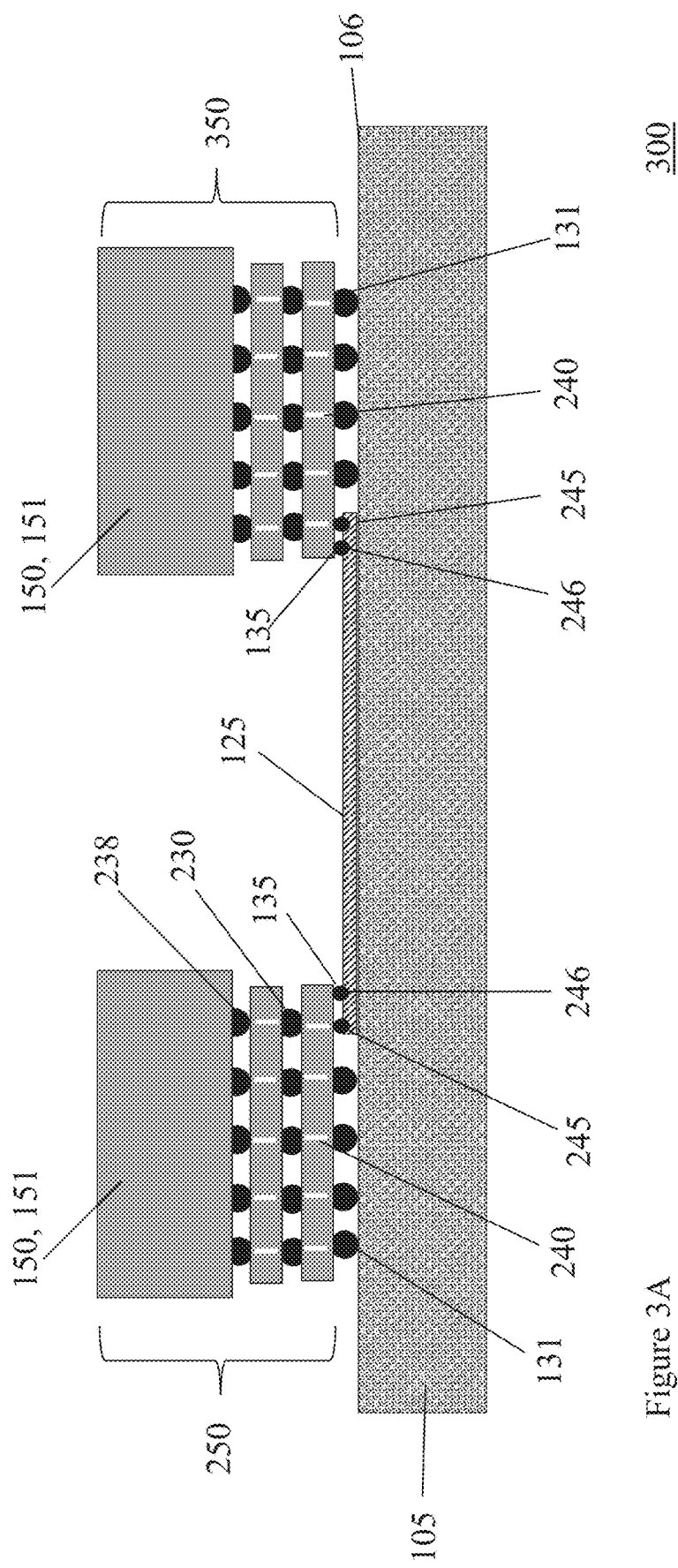
FIG. 3A is an elevation view of two die stacks on a ceramic substrate with a bridge interconnecting the die stacks to form an example MCM.

FIG. 3A is an elevation view of two die stacks (250, 350) on a ceramic substrate 105 with a bridge 125 interconnecting the die stacks (250, 350) to form an example MCM 300. FIG. 3A could also represent two die stacks (250, 350) on an organic substrate 105 with a high-density wiring bridge (silicon and/or organic) 125 interconnecting the die stacks (250, 350) to form an example MCM 300. In this embodiment, the die stack (250, 350) external connections 131 can connect directly to contacts on the surface 106 of the substrate 105. In alternative embodiments, one or more of the external connections 131 can be in contact with a substrate connection 140 made in the surface 106 of the substrate 105 as described above.

Figure 3B:
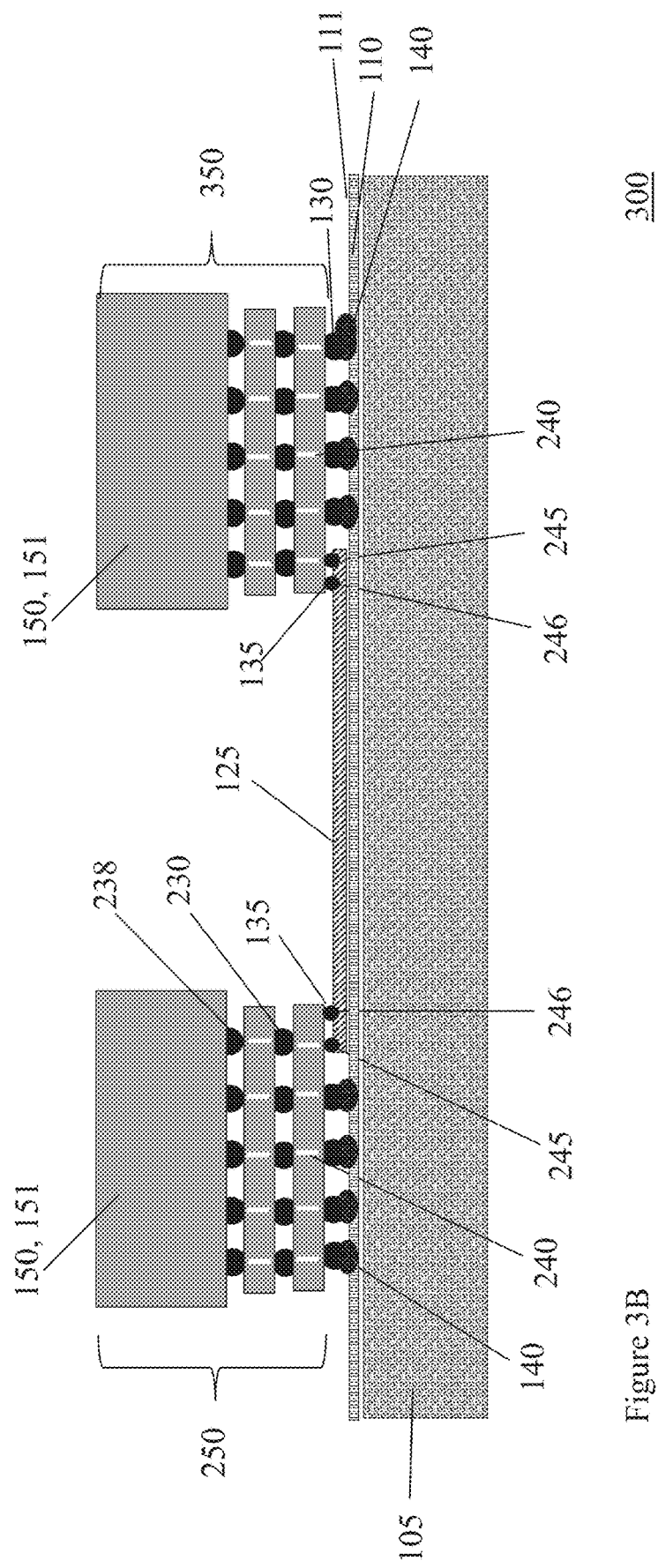
FIG. 3B is an elevation view of two die stacks on a ceramic substrate with a bridge and a large surface bridge interconnecting the die stacks to form an example MCM.

FIG. 3B is an elevation view of two die stacks (250, 350) on a ceramic substrate 105 with a bridge 125 and a large surface bridge 110 interconnecting the die stacks (250, 350) to form an example MCM 300. FIG. 3B could also represent two die stacks (250, 350) on an organic substrate 110 with a high-density wiring bridge (silicon and/or organic) 125 interconnecting the die stacks (250, 350) to form an example MCM 300

In this embodiment substrate connections 140 are accurately located in the surface 111 of the large surface bridge 110 by techniques described above and the interconnections can provide enhanced yield due to X-Y precision location of the interconnections, improved planarity of surface interconnections and added total height for interconnection to support improved interconnection robustness and reliability.

The bridge 125 can be attached to large surface bridge 110 by metal interconnections (Solder, Cu/Ni/Au or alternate material) plus an adhesive underfill, an adhesive only without metal and/or a thermal interconnection material (TIM). In some embodiments, the die stacks (250, 350) are then attached/electrically connected to the bridge 125 and large surface bridge 110 to create a subassembly. The subassembly can then be attached/electrically connected to the substrate 105, e.g. by use of a temporary handle technology or other technique. This process enables accurate positioning of the bridge 125, the large surface bridge 110, and the die stacks (250, 350) with respect to the substrate 105.

Figure 4A:
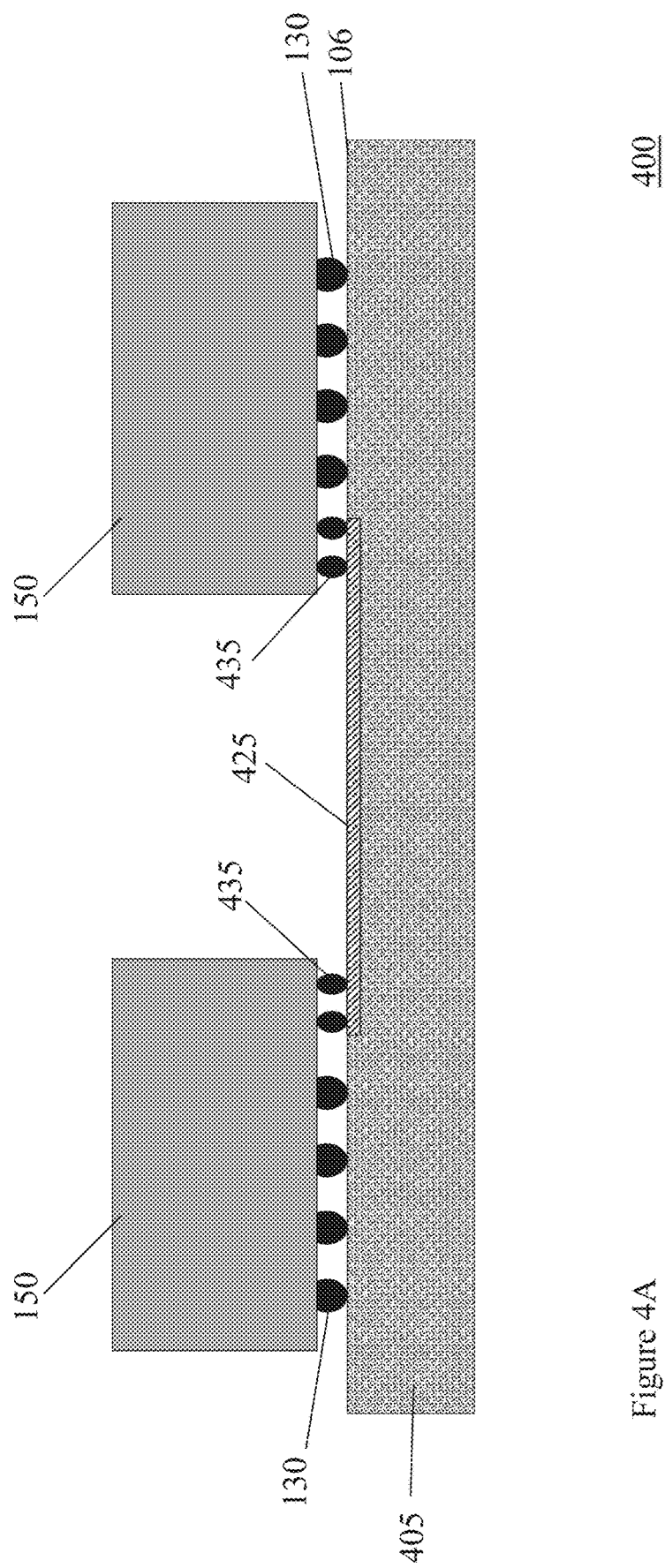
FIG. 4A is an elevation view of two chips on an organic substrate with a bridge that connects the two chips embedded in the substrate to form an example multi-chip module (MCM).

FIG. 4A is an elevation view of two chips 150 on an organic substrate 405 with a bridge 425 embedded in the substrate 405 where the bridge 425 connects the two chips 150 to form an example multi-chip module (MCM) 400.

Substrate 405 is a substrate like 105 with a trench in the surface. The bridge 125 inserted, e.g. with an adhesive, in the trench is bridge version 425.

In this embodiment, the bridge 425 is recessed into the organic substrate 405 allowing the bridge connections 435 to be higher. This might be done to reduce thermal cycling stresses on the connections. In some embodiments, the bridge connections 435 are similar in diameter to the substrate connections 130. In some embodiments the bridge connections 435 are different in diameter relative to the substrate connections 130.

In some embodiments, the surface 106 of the substrate 405 and surface 126 of the bridge 425 are co-planar. The height of interconnections from the chip 150 to the embedded, coplanar bridge 425 surface 126 is greater than if the bridge 425 is disposed on the surface 106 of the substrate 405. In the co-planar case, the height of the interconnects (130, 435) from the chip 150 to the substrate 405 and from the chip 150 to the bridge 425 are the same. Another advantage of having chips 150 co-planar with the bridge 425 and substrate 405 is that one or more than one chips 150 can be attached at the same time in assembly to the coplanar bridge 425 and substrate 405 with the same height interconnections with thermal compression bonding or area array furnace reflow. One or multiple die and the hybrid substrate 405 with bridge 425 can all be free standing during assembly interconnection joining or they can be held flat and co-planar using a temporary handle technology, vacuum fixture during bonding technology, use gradient temperature thermal compression bonding, use different or same solder composition for interconnect joining or Cu—Cu bonding technology or alternate bonding methods.

Figure 4B:
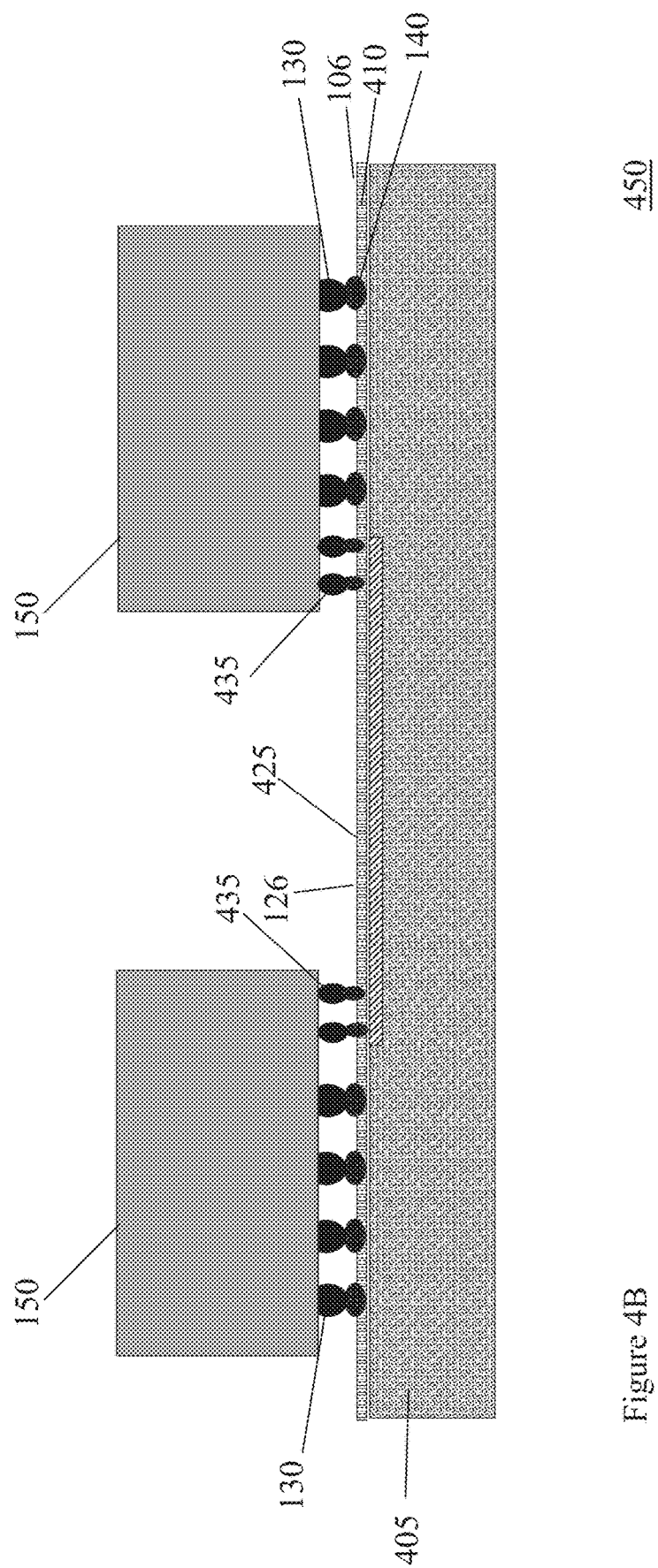
FIG. 4B is an elevation view of two chips on an organic substrate with a bridge embedded in the substrate and a large surface bridge that connect the two chips to form an example multi-chip module (MCM).

FIG. 4B is an elevation view of two chips 150 on an organic substrate 405 with a bridge 425 embedded in the substrate 405 and a large surface bridge 410 that connects the two chips 150 to form an example multi-chip module (MCM) 450.

In some embodiments, the large surface bridge 410 covers the entire surface of the substrate 405 in addition to the surface of the bridge 425. The large surface bridge 410 is made of materials, e.g. silicon or polyimide or alternate dielectric material, that is flat/planar over the entire surface. In addition, the large surface bridge 410 has a CTE and moduli of expansion that can be matched or near to the CTE and moduli of the bridge 425 and chips 150. The matched or near CTE match of a surface bridge reduces changes in surface co-planarity and stresses imposed during temperature cycling during build, assembly, and product use. The large surface bridge 410 also enables accurate pads and interconnection X and Y locations of contacts and precise control of contact height as described above.

Figure 5A:
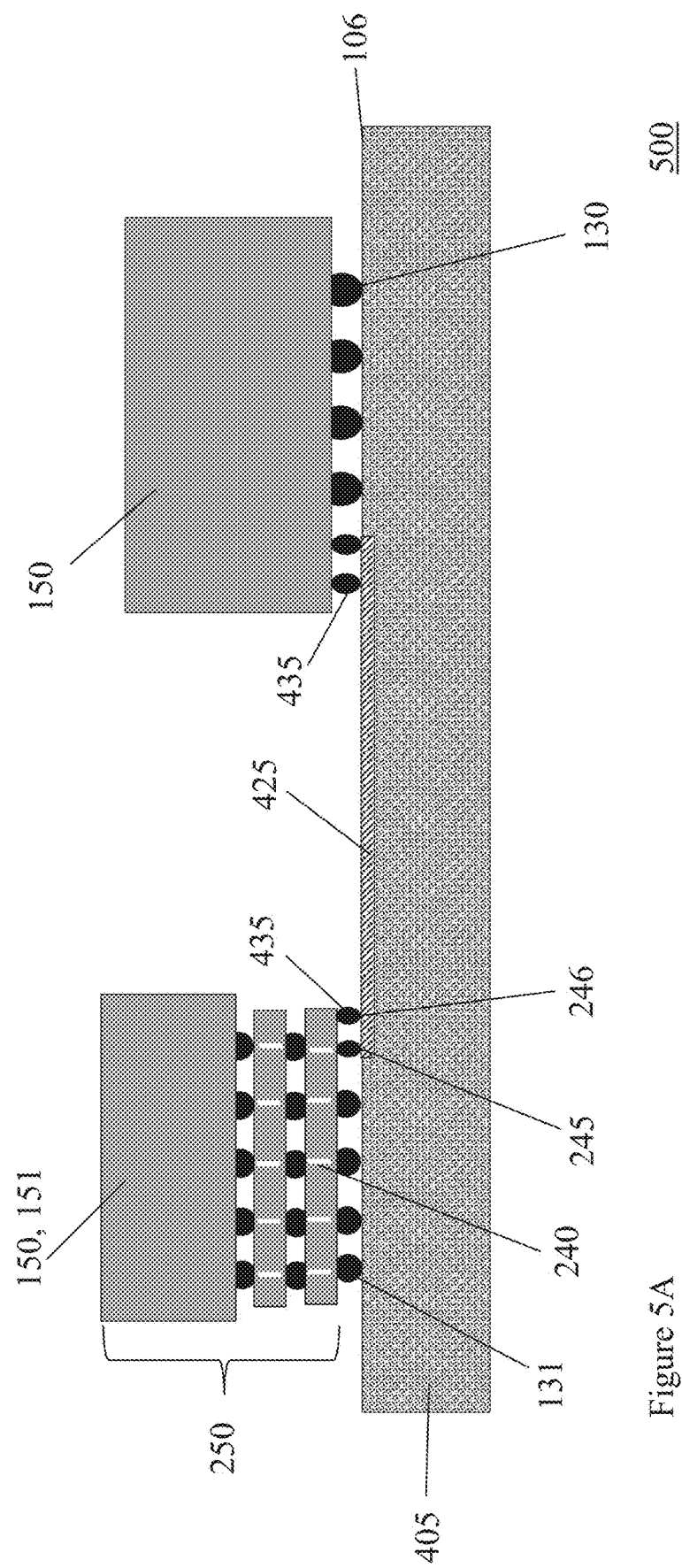
FIG. 5A is an elevation view of a die stack and a chip on an organic substrate with a bridge embedded in the substrate that connects the die stack and chip and forms an example multi-chip module (MCM).

FIG. 5A is an elevation view of a die stack 250 and a chip 150 on an organic substrate 405 with a bridge 425 embedded in the substrate 405 where the bridge 425 connects the die stack 250 and chip 150 to form an example multi-chip module (MCM) 500. In this embodiment, the bridge 425 is recessed into the organic substrate 405 as described in FIG. 4A. Note FIG. 5A could also represent an organic substrate 405 with a bridge 425 embedded in the surface of the substrate 405 where the bridge provides to interconnections between the chip(s) and die stack(s) for one or more interconnections (up to all signal connections in some cases but not shown) and for one or more chips and for one or more die stacks between the chip(s) and die stack(s).

Figure 5B:
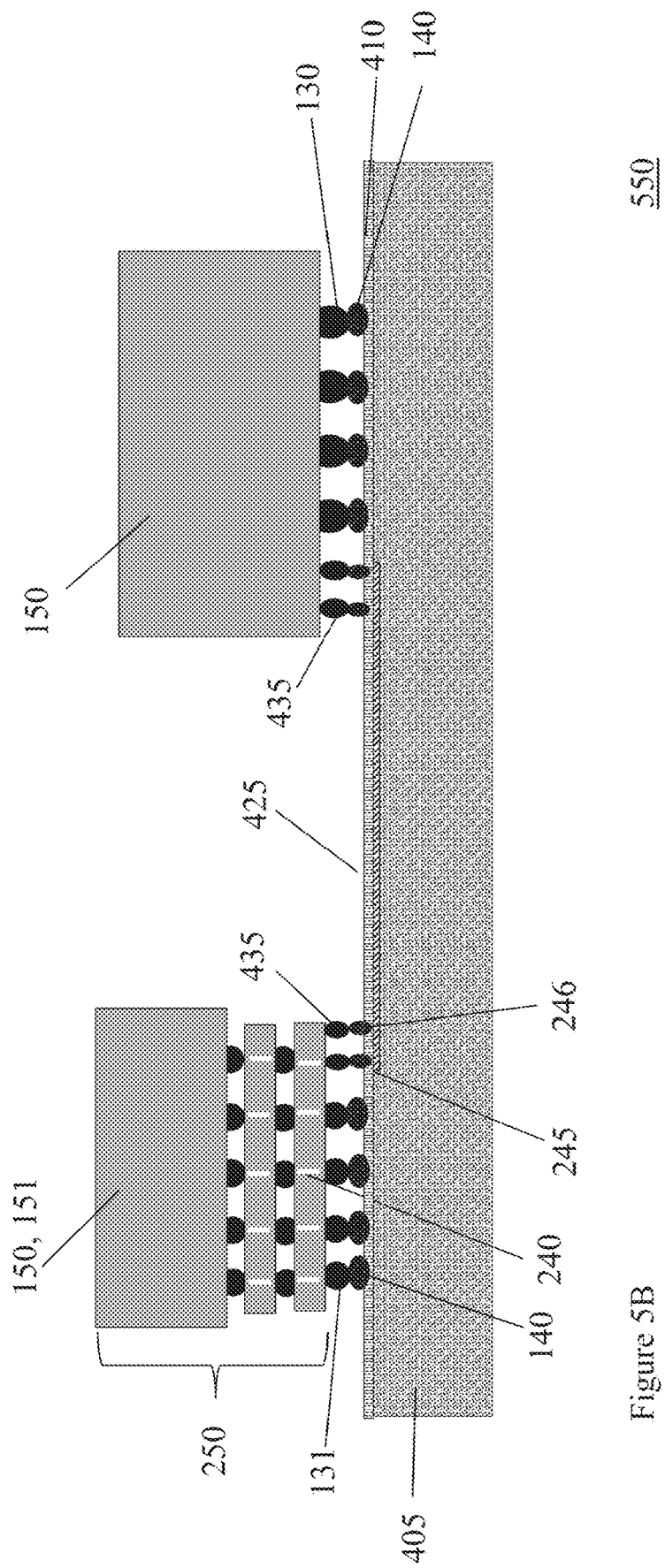
FIG. 5B is an elevation view of a die stack and a chip on an organic substrate with a bridge embedded in the substrate and a large surface bridge disposed over the substrate and where the bridge and large surface bridge connect the die stack and chip to form an example multi-chip module (MCM).

FIG. 5B is an elevation view of a die stack 250 and a chip 150 on an organic substrate 405 with a bridge 425 embedded in the substrate 405 and a large surface bridge 410 disposed over the substrate 405 and bridge 425 and where the bridge 425 and large surface bridge 410 connect the die stack 250 and chip 150 to form an example multi-chip module (MCM)

550. In some embodiments, the large surface bridge 410 covers all or substantially all the substrate 405 surface 106. In alternative embodiments, the large surface bridge 410 covers the substrate 405 surface 106 under part or all of the die stack(s) 250 and chip(s) 150 vertical projection onto the surface 106.

Figure 6A:
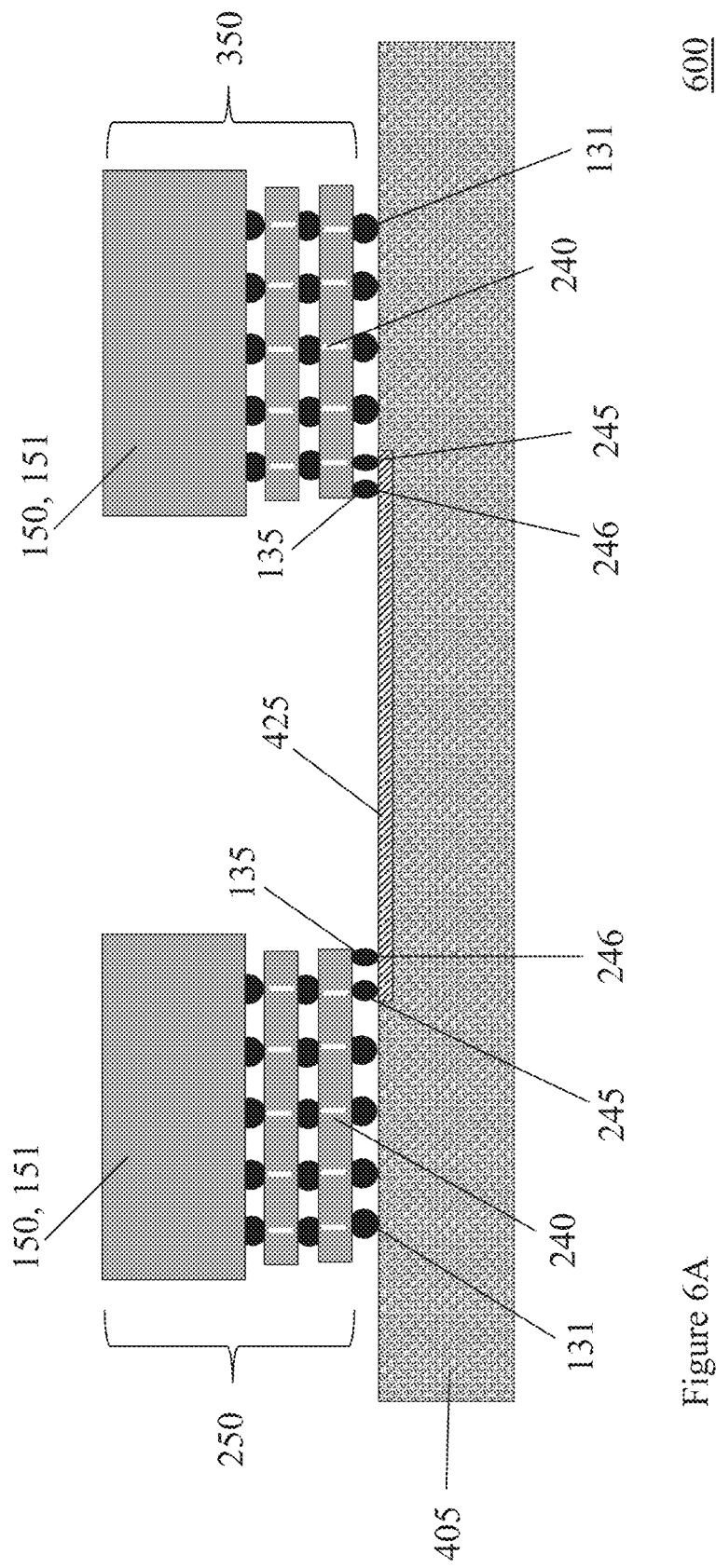
FIG. 6A is an elevation view of two die stacks on an organic substrate with a bridge embedded in the substrate and where the bridge connects the two die stacks to form an example multi-chip module (MCM).

FIG. 6A is an elevation view of two die stacks (250, 350) on an organic substrate 405 with a bridge 425 embedded in the substrate 405 where the bridge 425 connects the two die stacks (250, 350) to form an example multi-chip module (MCM) 600.

Figure 6B:
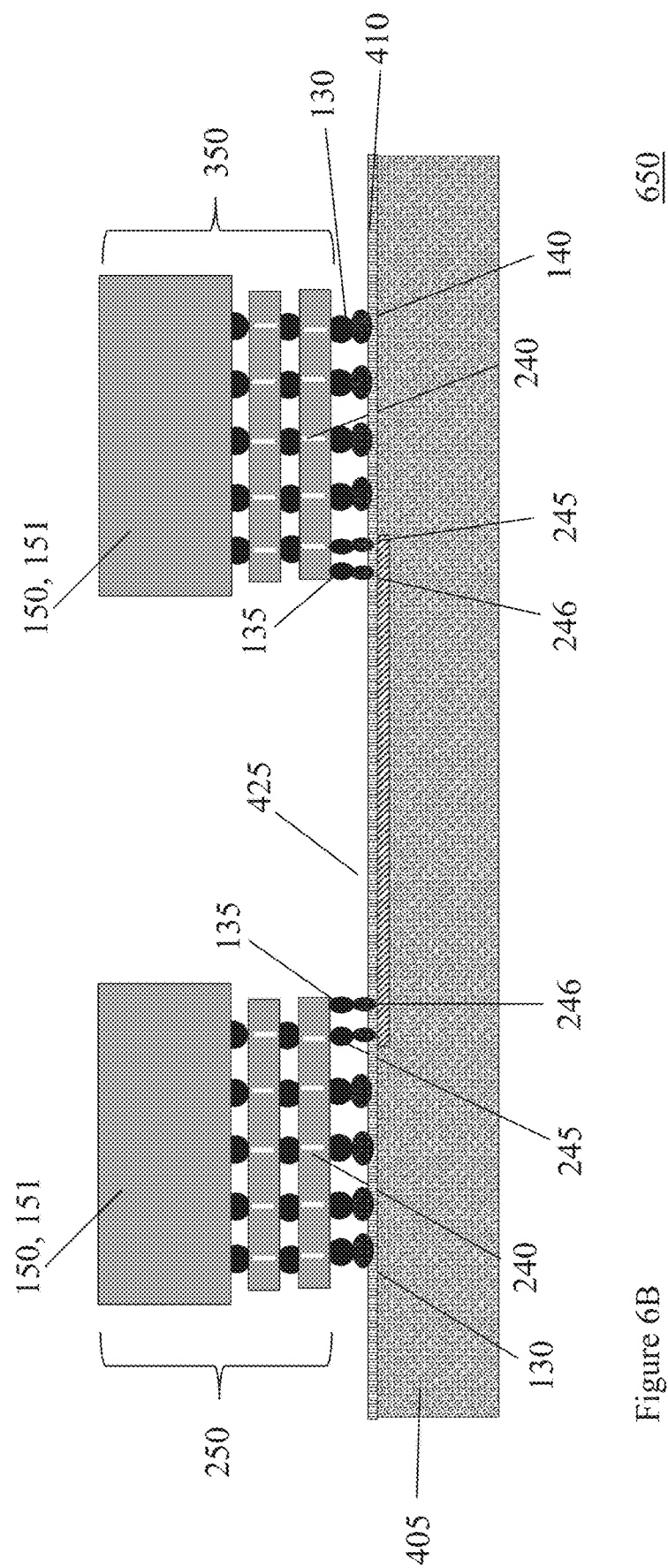
FIG. 6B is an elevation view of two die stacks on an organic substrate with a bridge embedded in the substrate and a large surface bridge disposed over the substrate and where the bridge and large surface bridge connect the two die stacks to form an example multi-chip module (MCM).

FIG. 6B is an elevation view of two die stacks (250, 350) on an organic substrate 405 with a bridge 425 embedded in the substrate 405 and a large surface bridge 410 disposed over the substrate 405 and where the bridge 425 and large surface bridge 410 connect the two die stacks (250, 350) to form an example multi-chip module (MCM) 650. The large surface bridge 410 can cover all or parts of the surface 106 of the substrate 405.

Figure 7:
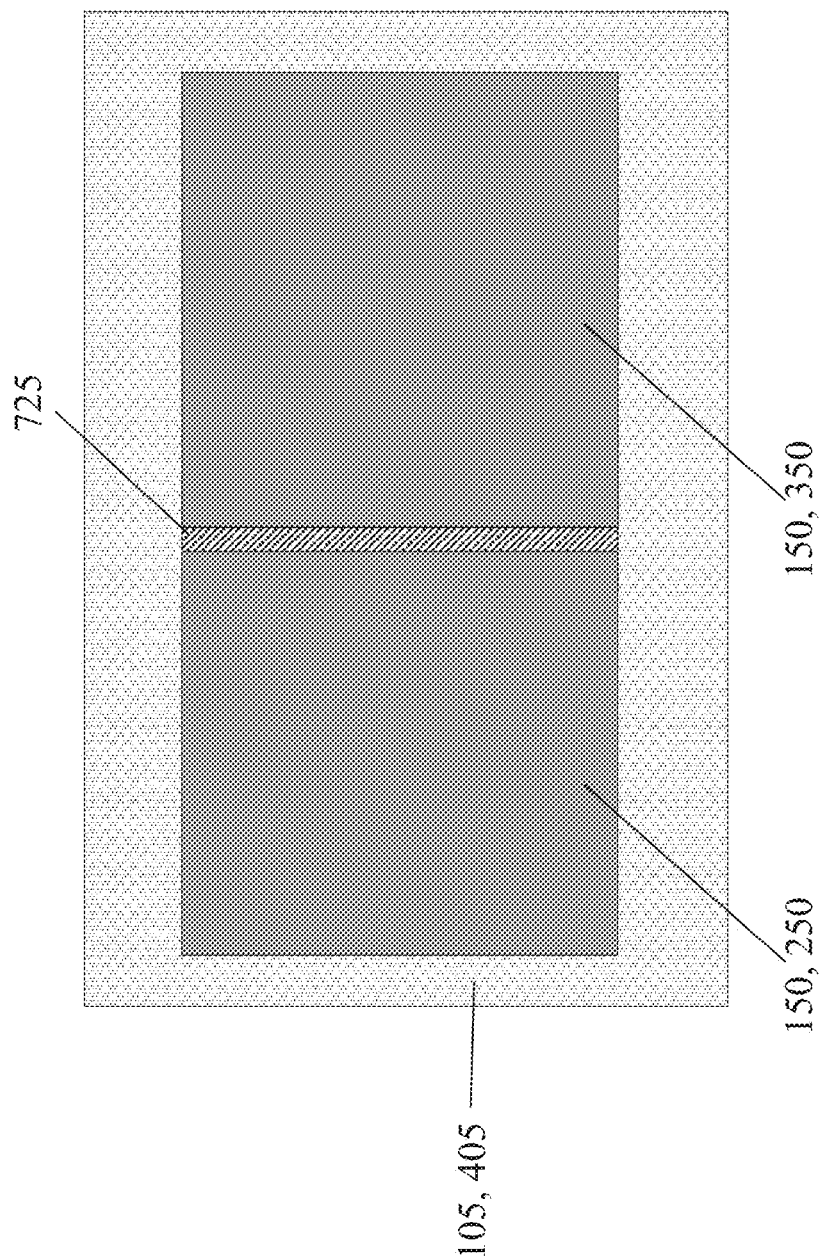
FIG. 7 is a top view of a silicon bridge connecting two chips in a MCM.

FIG. 7 is a top view of a pairwise silicon bridge 725 connecting a first single chip 150 or die stack 250 to a second single chip 150 or die stack 350 to form MCM 700. In this embodiment the bridge 725 makes connections only between the first single chip 150/die stack 250 and the second single chip 150/die stack 350.

The substrate (105, 405) can be a ceramic 105 in which case the bridge 725 is disposed on the substrate 105 or the substrate can be organic 405 in which case the bridge 725 may be recessed into the substrate 405.

Figure 8:
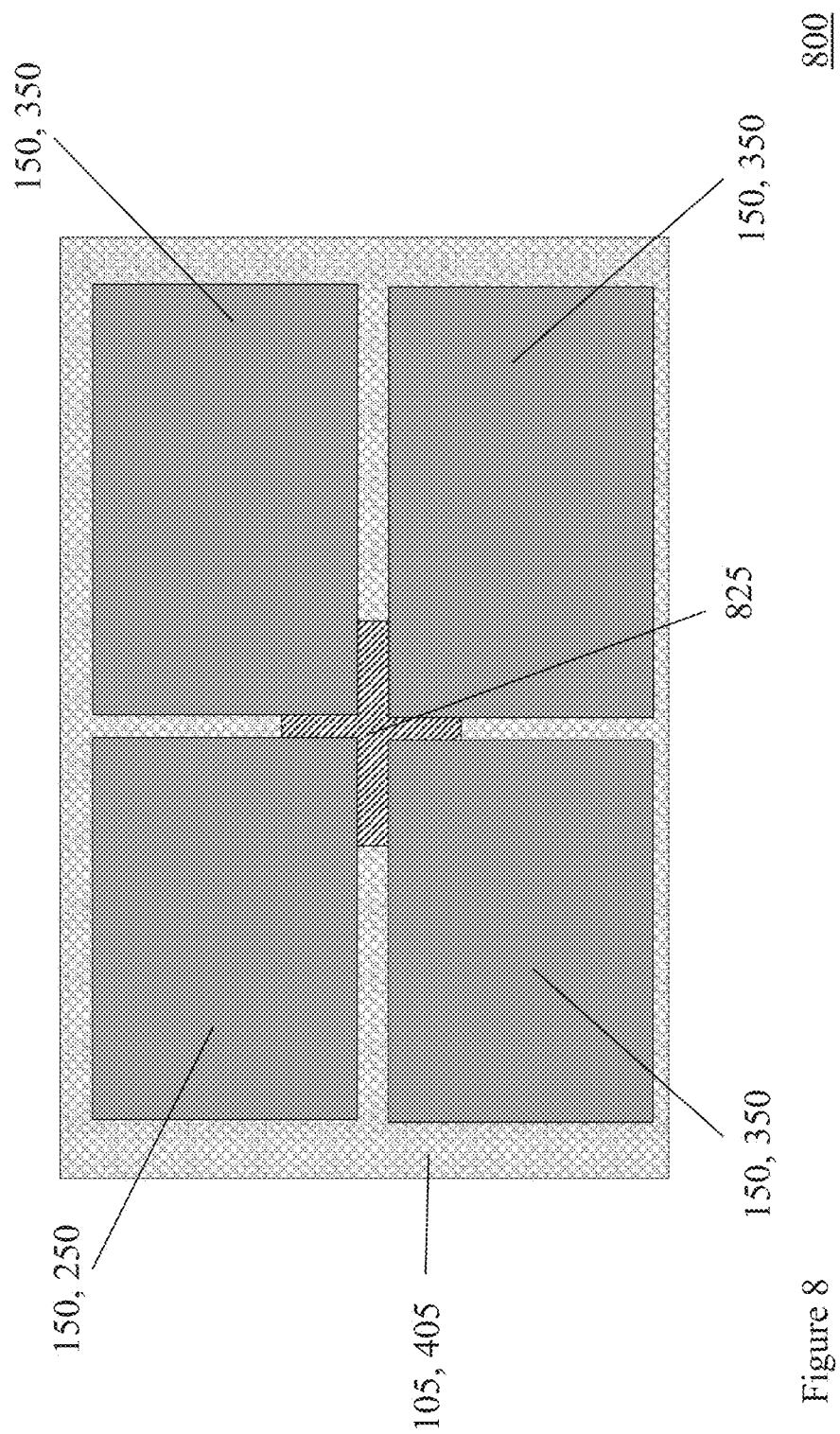
FIG. 8 is a top view of a single silicon bridge connecting four chips in a MCM.

FIG. 8 is a top view of a single silicon bridge 825 connecting four chips 150/die stacks 250 (a quadchip) to create a MCM 800 or a quadchip module (QCM). In this embodiment, the bridge 825 is in electrical contact with the contacts on a corner of each of the four chips 150 and/or die stacks (250, 350).

The substrate 105 can be a ceramic 105 in which case the bridge 825 is disposed on the substrate 105 or the substrate 405 can be organic 405 in which case the bridge 825 may be recessed into the substrate 405.

Figure 9:
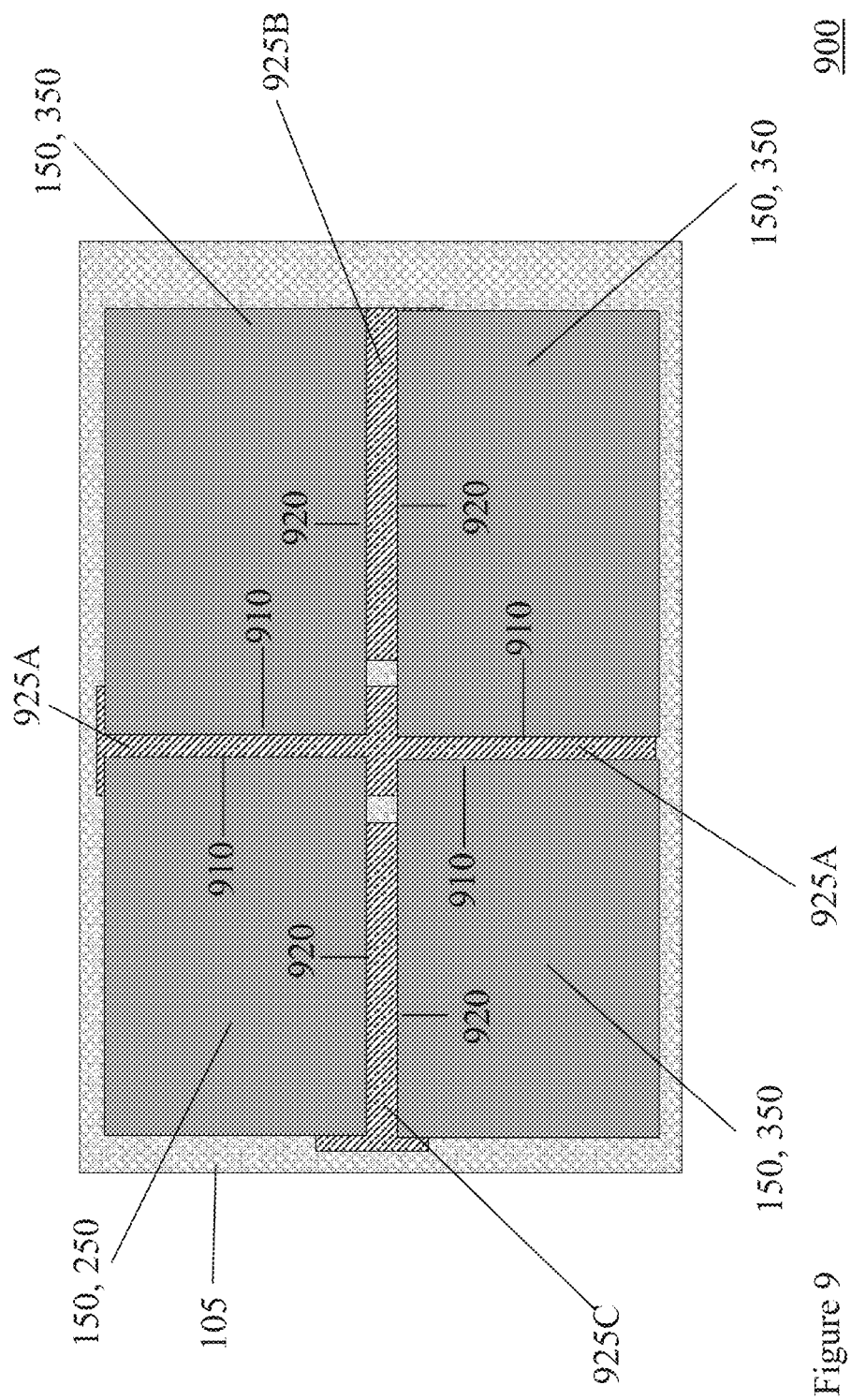
FIG. 9 is a top view of multiple silicon bridges connecting four chips in a MCM.

FIG. 9 is a top view of a MCM or QCM 900 with multiple silicon bridges (925A, 925B, and 925C) connecting four chips 150 and/or die stacks (250, 350). In this embodiment one bridge 925A is in contact with one or more connections (130, 135) on a first edge 910 of each of the 4 chips 150 and/or die stacks (250, 350). In addition, one of two pairwise bridges, (925B, 925C) is in contact with one or more connections (131, 135) on a second edge 920 of two adjacent chips 150 and/or die stacks (250, 350) where the second edge is perpendicular to the first edge.

The substrate 105 can be a ceramic 105 in which case the bridges (925A, 925B, 925C) are disposed on the substrate 105 or the substrate 405 can be organic 405 in which case the bridges (925A, 925B, 925C) may be recessed into the substrate 405.

Figure 10:
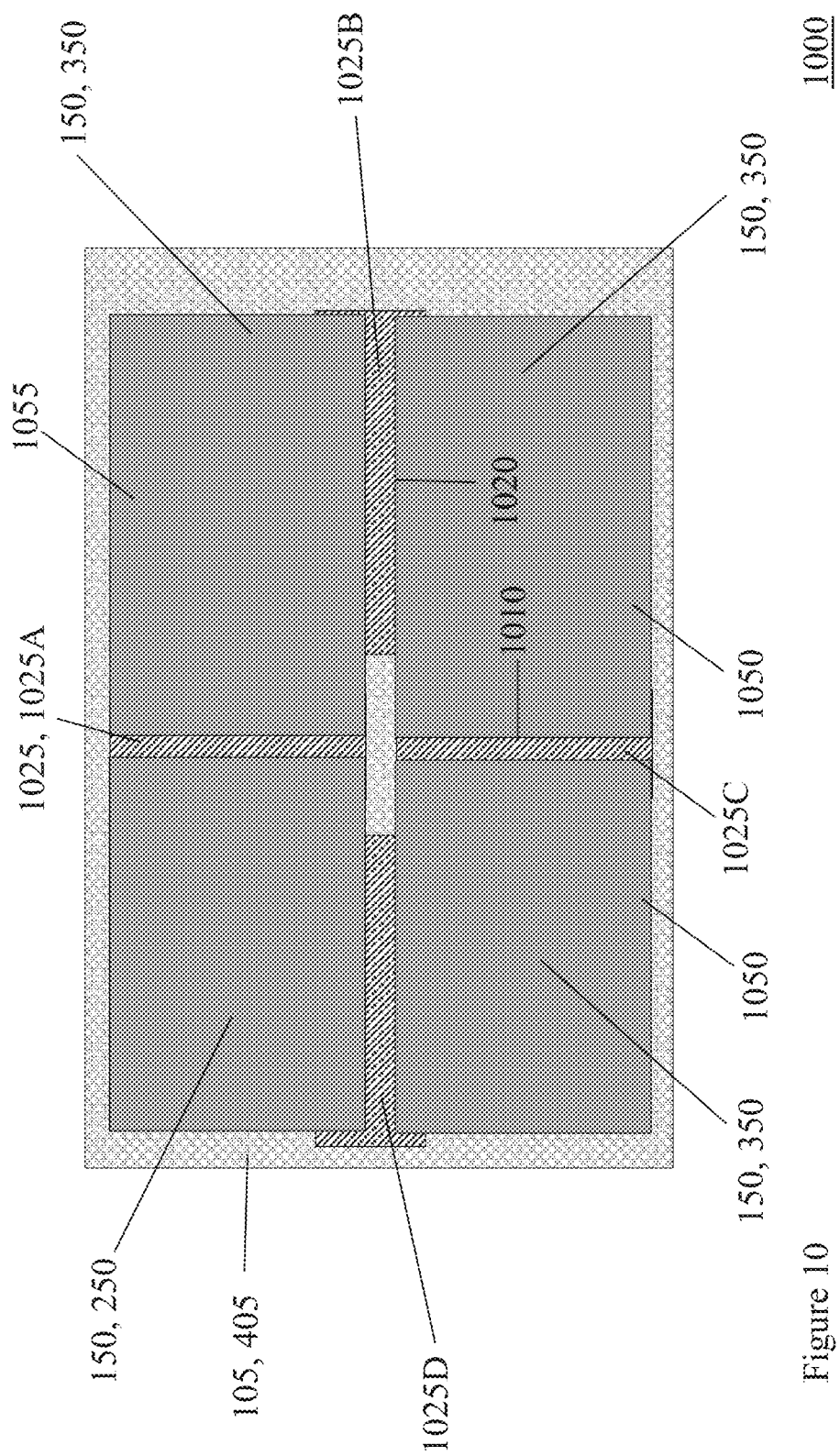
FIG. 10 is a top view of an alternative embodiment of multiple silicon bridges connecting four chips in a MCM.

FIG. 10 is a top view of an alternative embodiment of multiple pairwise connecting silicon bridges (1025A, 1025B, 1025C, and 1025D, typically 1025) connecting four chips in a MCM/QCM 1000.

Each of a first pairwise bridge 1025 is in contact with one or more connections (131, 135) on a first edge 1010 of each of two first-adjacent 1050 chips 150 and/or die stacks (250, 350). Each of a second pairwise bridge 1025 is in contact with one or more connections (131, 135) on a second edge 1020 of each of two second-adjacent (1050, 1055) chips 150 and/or die stacks (250, 350). The first edge 1010 of an adjacent 1050 chip 150/die stack (250, 350) is perpendicular to the second edge 1020 of the same adjacent 1050 chip/die stack (250, 350).

The substrate can be a ceramic 105 in which case the bridges 1025 are disposed on the substrate 105 or the substrate can be organic 405 in which case the bridges 1025 may be disposed on the surface or recessed into the substrate 405.

Figure 11:
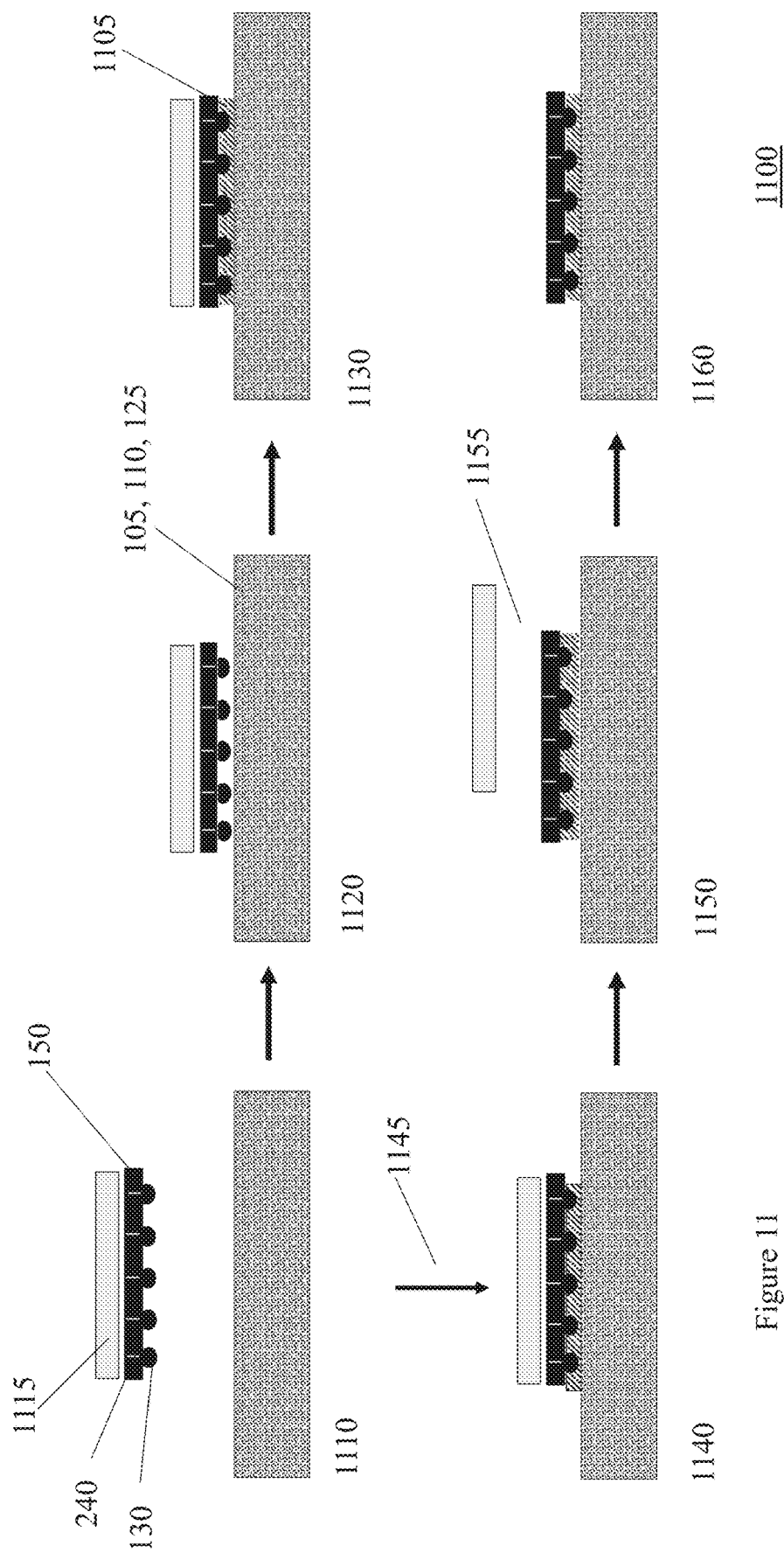
FIG. 11 is an illustration of using a first handle in a first module assembly process.

FIG. 11 is an illustration of the steps of using a first handle 1115 in a first module assembly process 1100.

Figure 12:
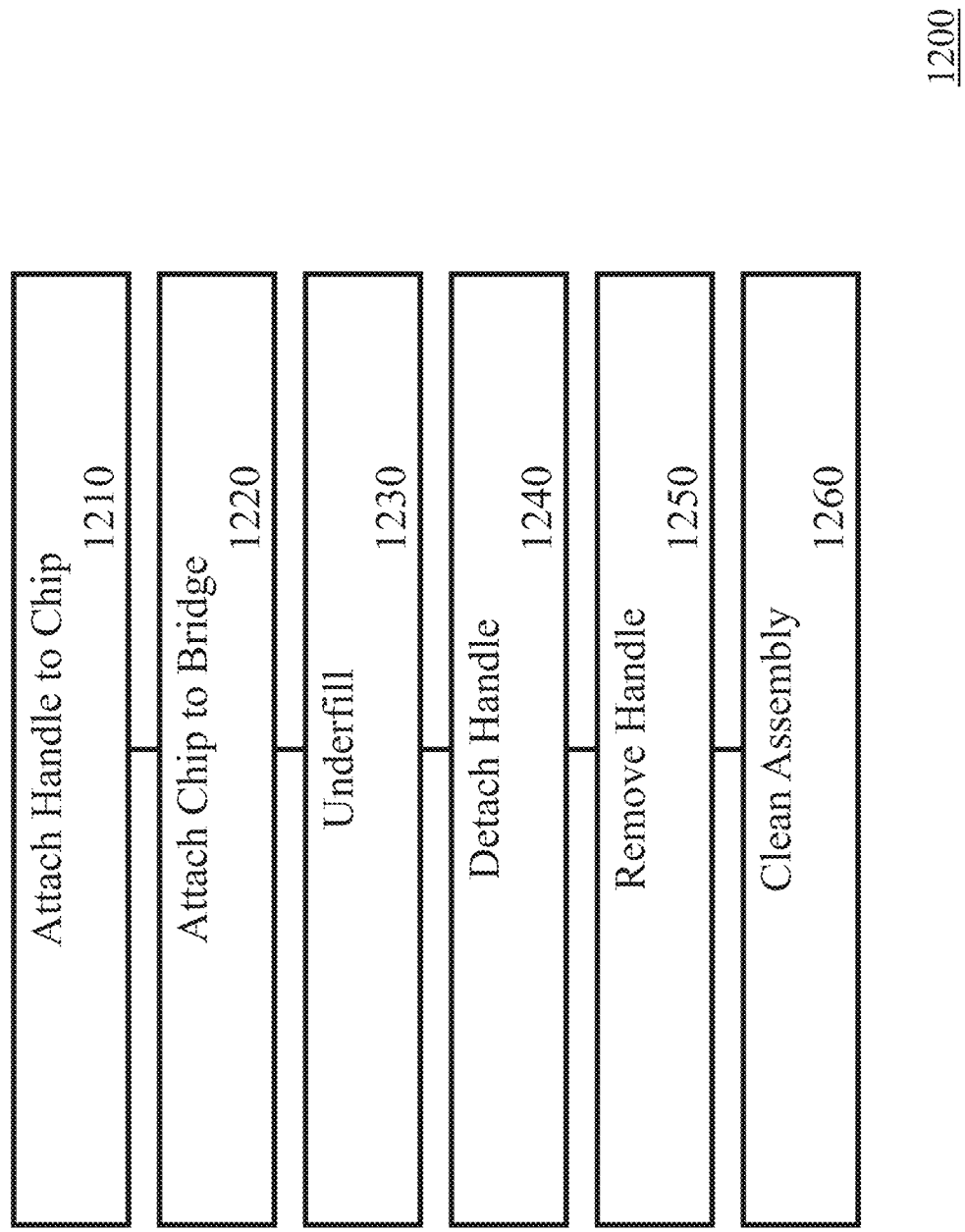
FIG. 12 is a flow chart of a first process using a first handle to configure two or more chips on a MCM connected by one or more silicon bridges.

FIG. 12 is a flow chart of the first process of configuring two or more chips 150 on a MCM connected by one or more silicon bridges (110, 125) using a first handle 1115.

In step (1110, 1210), one or more chips/dies 150 is attached to a with temporary first handle 1115. The first handle 1115 is attached to the back side (the side with no contacts 130/135) of the chip/die 150. The handle is made of a flat, rigid material like Si or glass. The chip 150 can be attached to one or more interconnecting layers 260 with one or more layer vias 240.

In some embodiments, the temporary first handle 1115 was attached to a wafer or die with a release layer and adhesive. In other embodiments, the temporary handle 1115 is attached with a vacuum fixture.

In step (1120, 1220) the chip 150 and handle 1115 assembly is accurately manipulated by the first handle 1115 to be placed on the bridge (110, 125). The contacts 130 are reflowed by known methods (e.g. heat, compression bonding, etc.) to become physically and electrically attached to contacts (not shown) on the bridge (110, 125) and/or substrate 105.

In step (1130, 1230) underfill adhesive 1105 is inserted in the space between the bottom of the chip and surface of the substrate/bridge (105, 110, 125). In alternative embodiments, the underfill adhesive is pre-applied to the bottom of the chip/die 150 and/or the surface of the substrate 105 and/or bridge (110, 115). The underfill adhesive bonds and cures.

In step (1140, 1240) the first handle 1115 is detached from the chip 150. Where a vacuum fixture is used, the vacuum is released. Where an adhesive is used, electromagnetic radiation, e.g. applied by a laser scan through Si or glass handle, ablates the adhesive layer to detach the handle from the chip 150.

In step (1150, 1250) the handle 1115 is removed 1155 from the chip 150.

In step (1160, 1260) the chip 150 is attached to the substrate 105 and/or bridge (110, 115) and the assembly is cleaned with a solvent and/or a plasma to remove any residue from the adhesive or soldering reflow step. The assembly is now ready for additional assembly and/or testing.

Figure 13:
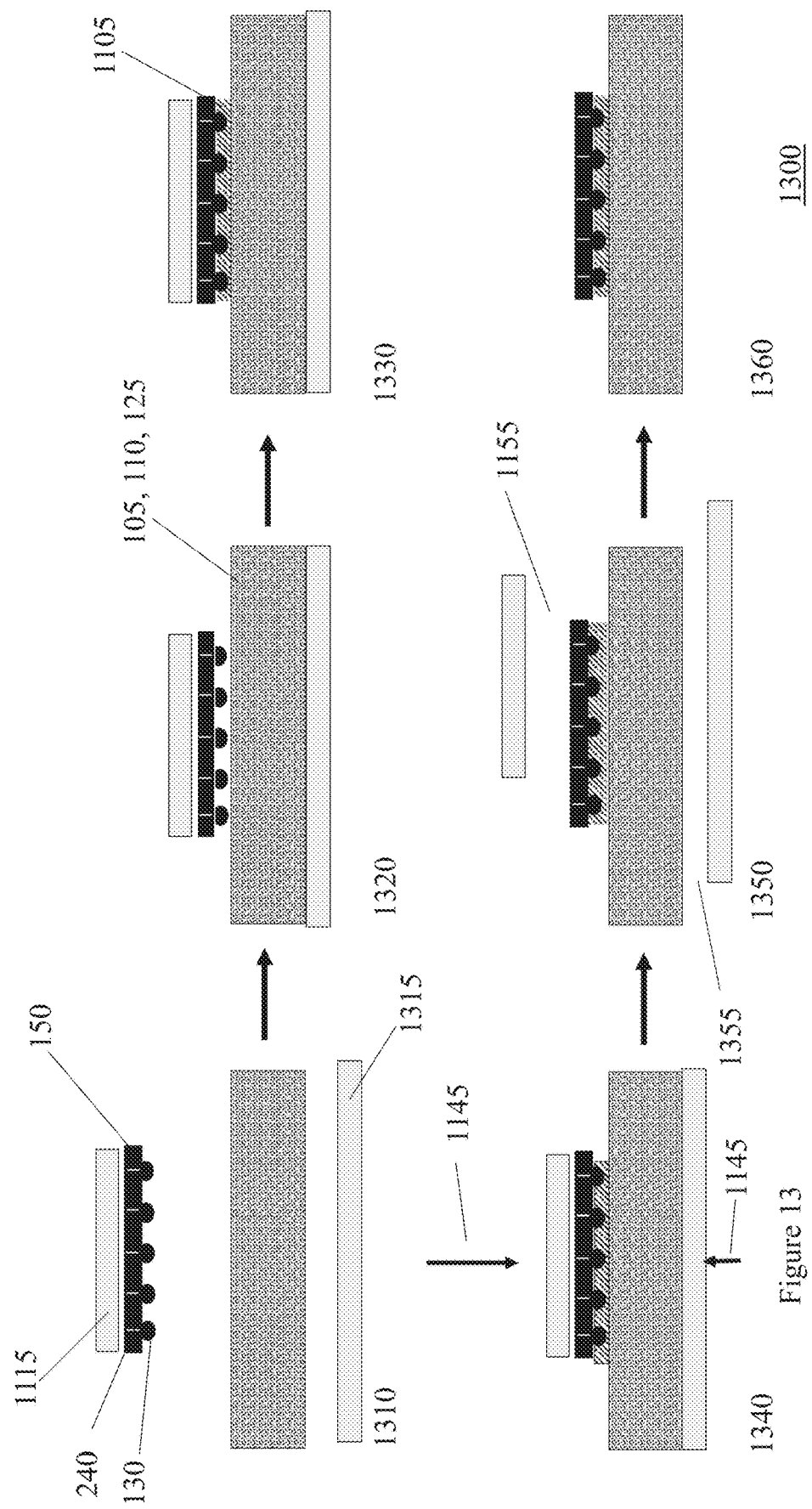
FIG. 13 is an illustration of using a first and second handle in a second module assembly process.

FIG. 13 is an illustration of using multiple handles in a second module assembly process.

Figure 14:
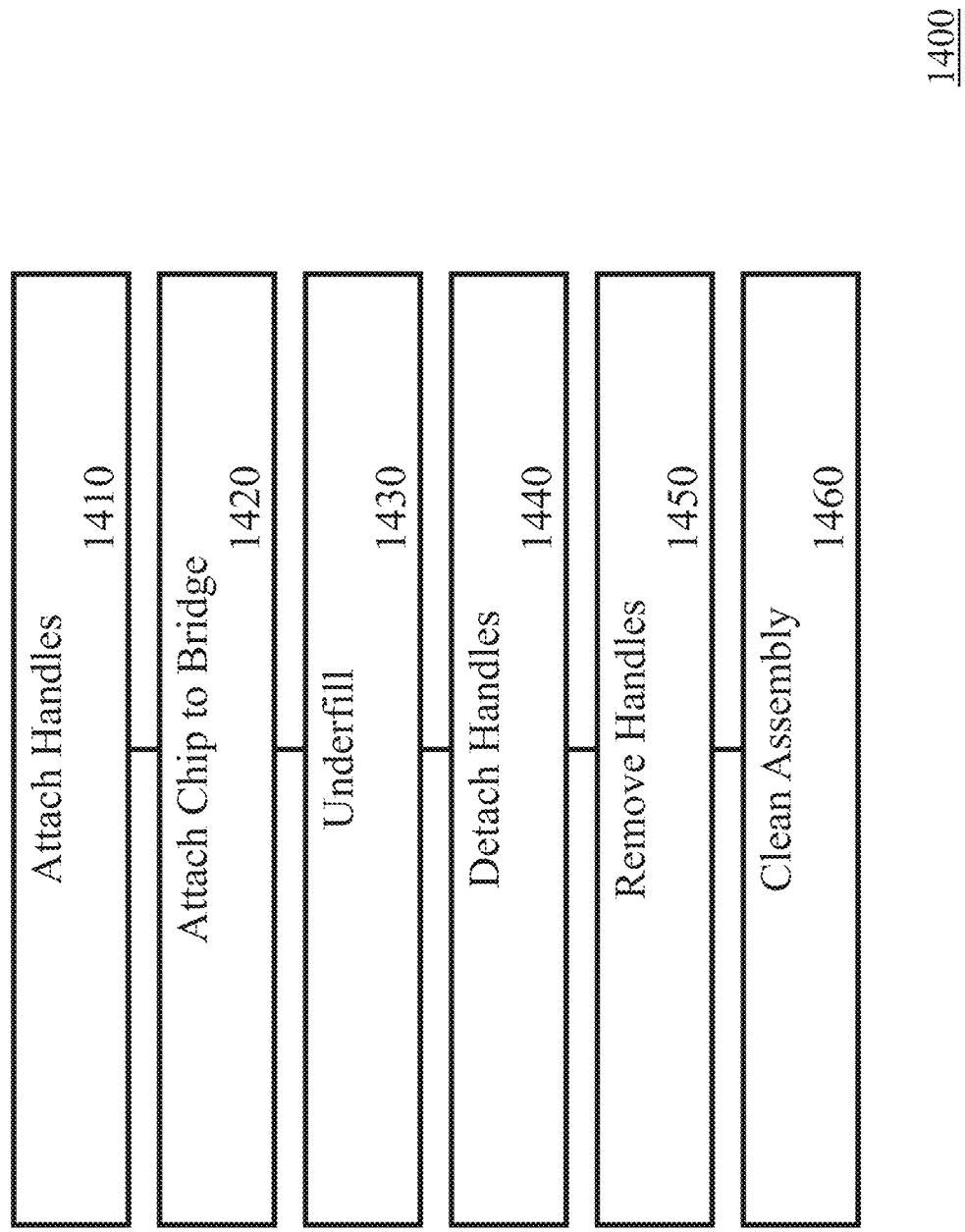
FIG. 14 is a flow chart of the second process of using a first and second handle for configuring two or more chips on a MCM connected by one or more silicon bridges.

FIG. 14 is a flow chart of a second process using multiple handles (a first and a second handle) to configure two or more chips on a MCM connected by one or more silicon bridges.

In step (1310, 1410), one or more chips/dies 150 is attached to a with temporary first handle 1115. The first handle 1115 is attached to the back side (the side with no contacts 130/135) of the chip/die 150. The first handle is made of a flat, rigid material like Si or glass. The chip 150 can be attached to one or more interconnecting layers 260 with one or more layer vias 240.

Made of similar materials and being attached in a similar manner, a second handle 1315 is connected to the substrate 105, large bridge 110, or bridge 125. The second handle 1315 is attached so that connection points on the substrate 105, large area bridge 110, and/or bridge 125 are exposed after the second handle 1315 is attached.

In some embodiments, the temporary handles (1115, 1315) were attached to a wafer or die with a release layer and adhesive. In other embodiments, one or more of the temporary handles (1115, 1315) were attached with a vacuum fixture.

In step (1320, 1420) the chip 150 and first handle 1115 assembly and the substrate/bridge (105, 110, 125) and second handle 1315 assembly are accurately manipulated together by the first 1115 and second 1315 handlers to place the chip(s) 150 on the substrate 105 or bridge (110, 125). The contacts (130, 135) are reflowed by known methods (e.g. heat, compression bonding, etc.) to become physically and electrically attached to contacts (not shown) on the bridge (110, 125) and/or substrate 105.

In step (1330, 1430) underfill adhesive 1105 is inserted in the space between the bottom of the chip and surface of the substrate/bridge (105, 110, 125). In alternative embodiments, the underfill adhesive is pre-applied to the bottom of the chip/die 150 and/or the surface of the substrate 105 and/or bridge (110, 115). The underfill adhesive bonds and cures.

In step (1340, 1440) the first handle 1115 is detached 1155 from the chip 150. The second handle 1350 can be detached at this time or optionally at a later time. Where a vacuum fixture is used, the vacuum is released. Where an adhesive is used, electromagnetic radiation 1145, e.g. applied by a laser scan, through Si or glass handle. The laser ablates the adhesive layer to detach the handles (11 from the chip 150.

In step (1350, 1350) the first handle 1115 is removed 1155 from the chip 150. Optionally, the second handle 1315 is also removed 1355.

In step (1360, 1460) the chip 150 is attached to the substrate 105 and/or bridge (110, 115) and the assembly is cleaned with a solvent and/or a plasma to remove any residue from the adhesive or soldering reflow step. The assembly is now ready for additional assembly and/or testing.

In some embodiments, the handle(s), 1115/1315 enable accurately positioning and joining the chips 150 and/or die stack(s) 250 to the substrate 105/bridge (110, 125) by forming the interconnections (e.g. 130, 135) and inserting the underfill 1105 while temporary handle(s) lock chips/die stacks (150, 250) onto the substrate 105 and/or bridges (110, 125). With the first handle 1115 connected the chip/die stack assembly can be flipped and the substrate 105 and/or bridges (110, 125) can be positioned on and connected to an organic package with a controlled CTE. The handler 1115 permits accurate positioning of the assembly so the bridge (110, 125) is positioned to be disposed on the organic package or within an insert in the organic package to result in the appropriate height of the contacts 130 connecting to the organic package with the correct spacings (160, 170) and planarities. In addition, the Distance to Neutral Point (DNP) of composite has to be considered for design of composite multiple die(s) and bridge(s) along with interconnection height for co-planarity, current conduction, and composite controlled CTE of the organic package or ceramic package or alternate hybrid package(s). Note based on design and mechanical modeling of stress, temperature of joining solder, copper-copper bonding, DNP, modulus of underfills for bridge versus composite die(s)/bridge(s) to organic package or alternate package, the module can be assembled using temporary handle technology or vacuum fixture technology, graded thermal compression bonding technology, area array reflow technology or alternate assembly technology with high yield and high product reliability.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

I claim:

1. A multi-semiconductor chip module comprising:
   a substrate having a substrate surface, one or more first substrate connections, and one or more second substrate connections;
   one or more first semiconductor chips (chips) having one or more larger first chip connections and one or more smaller first chip connections on a first chip bottom surface, one or more of the larger first chip connections physically and electrically connected to a respective first substrate connection;
   one or more second chips having one or more larger second chip connections and one or more smaller second chip connections on a second chip bottom surface, one or more of the larger second chip connections physically and electrically connected to a respective second substrate connection;
   a bridge with a bridge thickness, a bridge surface, and one or more bridge connections on the bridge surface, a first part of the bridge surface being under the first chip bottom surface and a second part of the bridge surface being under the second chip bottom surface, the bridge being disposed on the substrate between the first semiconductor chip and the second semiconductor chip, and one or more of the smaller first chip connections is physically and electrically connected to a respective first bridge connection on the first part of the bridge surface and one or more of the smaller second chip connection is physically and electrically connected to a respective second bridge connection,
   wherein the bridge thickness allows the larger first chip connections, the smaller first chip connections, the larger second chip connections, and the smaller second chip connections to interconnect through high density in a location within the module, and
   wherein the coefficients of thermal expansion (CIEs) of the substrate, the bridge, and the first and second chips differ by no more than 15 ppm.

2. A module, as in claim 1, where the smaller first chip connections and the smaller second chip connections have a pitch of less than 120 um.

3. A module, as in claim 1, further where one or more of the first and second substrate connections sit proud above the substrate surface.

4. A module, as in claim 1, where the CTEs of the substrate, the bridge, and the first and second chips all are in the range of 6 to 12 ppm for fine pitch die where the bridge or area array connections have a pitch of less than 60 um and first chip, second chip, one or more die stacks, the bridge have a fine pitch in an X and/or Y direction between 5 millimeters and 50 mm.

5. A module, as in claim 1, where the first and second chips are part of a die stack.

6. A module, as in claim 1, where the bridge has one or more through vias.

7. A module, as in claim 1, where the connections are made of a low temperature solder.

8. A module, as in claim 1, where one or more of the larger first and second chip connections are power connections and one or more smaller first and second chip connections are connections for one or more of the following: a signal, a control, and a communication.

9. A module, as in claim 1, where the bridge thickness is between 1 micrometers (um) and 50 um to establish a co-planar surface of the substrate and interconnections co-planarity with precision location of interconnections or pads with height or length of interconnections of between 1 um and 80 um between the bridge or substrate surface and the first and second chip bottom surfaces.

10. A module, as in claim 9, where the co-planar height of pads or interconnections varies no more than +/−3 um over the first and second chip bottom surfaces.

11. A multi-semiconductor chip module comprising:
   a substrate having a substrate surface, one or more first substrate connections, and one or more second substrate connections;
   one or more first semiconductor chips (chips) having one or more larger first chip connections and one or more smaller first chip connections on a first chip bottom surface, one or more of the larger first chip connections physically and electrically connected to a respective first substrate connection;
   one or more second chips having one or more larger second chip connections and one or more smaller second chip connections on a second chip bottom surface, one or more of the larger second chip connections physically and electrically connected to a respective second substrate connection;
   a bridge with a bridge thickness, a bridge surface, and one or more bridge connections on the bridge surface, a first part of the bridge surface being under the first chip bottom surface and a second part of the bridge surface being under the second chip bottom surface, the bridge being disposed on the substrate between the first semiconductor chip and the second semiconductor chip, and one or more of the smaller first chip connections is physically and electrically connected to a respective first bridge connection on the first part of the bridge surface and one or more of the smaller second chip connection is physically and electrically connected to a respective second bridge connection;
   a large surface bridge with a large bridge thickness, a large bridge surface, and one or more large bridge connections on the bridge surface, the large surface bridge being disposed on the substrate;
   wherein the bridge thickness allows the larger first chip connections, the smaller first chip connections, the larger second chip connections, and the smaller second chip connections to intermingled in a location within the module.

12. A module, as in claim 11, where the large surface bridge is disposed on substrate surface and the bridge is disposed on the large surface bridge.

13. A module, as in claim 11, where the bridge is embedded in the substrate surface and the large surface bridge is disposed over the bridge and on the substrate surface.

14. A method of making a semiconductor module, comprising the steps of:
   attaching a first handle to one or more chips on a top side of the chips, there being no contacts on the top side;
   attaching a second handle to the bridge, where the first and second handles move the chip and the bridge together to attach the chip to the bridge;
   attaching one or more of the chips to the bridge by connecting one or more chip contacts on a bottom side of the chip to one or more respective contacts on the bridge, the chips attached to the bridge forming an assembly;
   applying under ill between the bottom side and the bridge; and
   removing the first handle and the second handle continues to position the assembly.

15. A method, as in claim 14, where the first handle is transparent to electromagnetic radiation and the first handle is attached to the top side of the chips with an adhesive and where the first handle is detached by exposing the adhesive to electromagnetic through the first handle.

16. A method, as in claim 14, where the first handle is attached to the top side of the chips with a vacuum and where the first handle is detached by removing the vacuum.

17. A method, as in claim 14, where the second handle is removed and the first handle continues to position the assembly on an organic package, where the organic package has a controlled coefficient of thermal expansion (CTE).

* * * * *